US010998339B2

(12) United States Patent
Morris et al.

(10) Patent No.: US 10,998,339 B2
(45) Date of Patent: May 4, 2021

(54) ONE TRANSISTOR AND FERROELECTRIC FET BASED MEMORY CELL

(71) Applicant: Intel Corporation, Santa Clara, CA (US)

(72) Inventors: Daniel H. Morris, Hillsboro, OR (US); Uygar E. Avci, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/347,085

(22) PCT Filed: Dec. 12, 2016

(86) PCT No.: PCT/US2016/066056
§ 371 (c)(1),
(2) Date: May 2, 2019

(87) PCT Pub. No.: WO2018/111215
PCT Pub. Date: Jun. 21, 2018

(65) Prior Publication Data
US 2019/0273087 A1    Sep. 5, 2019

(51) Int. Cl.
*G11C 5/10* (2006.01)
*H01L 27/1159* (2017.01)
(Continued)

(52) U.S. Cl.
CPC .......... *H01L 27/1159* (2013.01); *G11C 11/22* (2013.01); *G11C 11/223* (2013.01);
(Continued)

(58) Field of Classification Search
CPC . G11C 11/22; G11C 11/2273; G11C 11/2275; G11C 11/221; G11C 11/5657;
(Continued)

(56) References Cited

U.S. PATENT DOCUMENTS 5,218,568 A    6/1993    Lin et al.
5,412,596 A    5/1995    Hoshiba
(Continued)

FOREIGN PATENT DOCUMENTS

WO    2016190880 A1    12/2016
WO    2018111215 A1    6/2018

OTHER PUBLICATIONS

PCT—Jul. 28, 2017 International Search Report and Written Opinion from International Application No. PCT/US2016/066056.
(Continued)

*Primary Examiner* — Hien N Nguyen
(74) *Attorney, Agent, or Firm* — Patent Capital Group

(57) ABSTRACT

Described herein are ferroelectric memory cells and corresponding methods and devices. For example, in some embodiments, a ferroelectric memory cell disclosed herein includes one access transistor and one ferroelectric transistor (1T-1FE-FET cell). The access transistor is coupled to the ferroelectric transistor by sharing its source/drain terminal with that of the ferroelectric transistor and is used for both READ and WRITE access to the ferroelectric transistor.

20 Claims, 18 Drawing Sheets

(51) Int. Cl.
*H01L 29/78* (2006.01)
*G11C 11/22* (2006.01)
*H01L 29/786* (2006.01)
*H01L 27/092* (2006.01)
*H01L 29/423* (2006.01)

(52) U.S. Cl.
CPC ...... *G11C 11/2273* (2013.01); *G11C 11/2275* (2013.01); *H01L 27/0924* (2013.01); *H01L 29/42392* (2013.01); *H01L 29/785* (2013.01); *H01L 29/78391* (2014.09); *H01L 29/78696* (2013.01)

(58) Field of Classification Search
CPC ......... G11C 7/18; G11C 8/08; G11C 11/2255; G11C 11/2257; G11C 8/10; G11C 8/16; G11C 11/1659; G11C 11/02
See application file for complete search history.

(56) References Cited

U.S. PATENT DOCUMENTS

| 5,515,311 | A | 5/1996 | Mihara | |
| 2012/0134197 | A1* | 5/2012 | Byun | G11C 11/22 365/145 |
| 2012/0314476 | A1 | 12/2012 | Appenzeller et al. | |
| 2016/0027490 | A1 | 1/2016 | Müller | |
| 2017/0345479 | A1* | 11/2017 | Chih | G11C 11/2275 |
| 2019/0287617 | A1* | 9/2019 | Tanaka | G11C 11/223 |

OTHER PUBLICATIONS

Sheikholeslami, Ali, "A Survey of Circuit Innovations in Ferroelectric Random-Access Memories," Proceedings of the IEEE, vol. 88, No. 5, May 2000; 23 pages.

\* cited by examiner

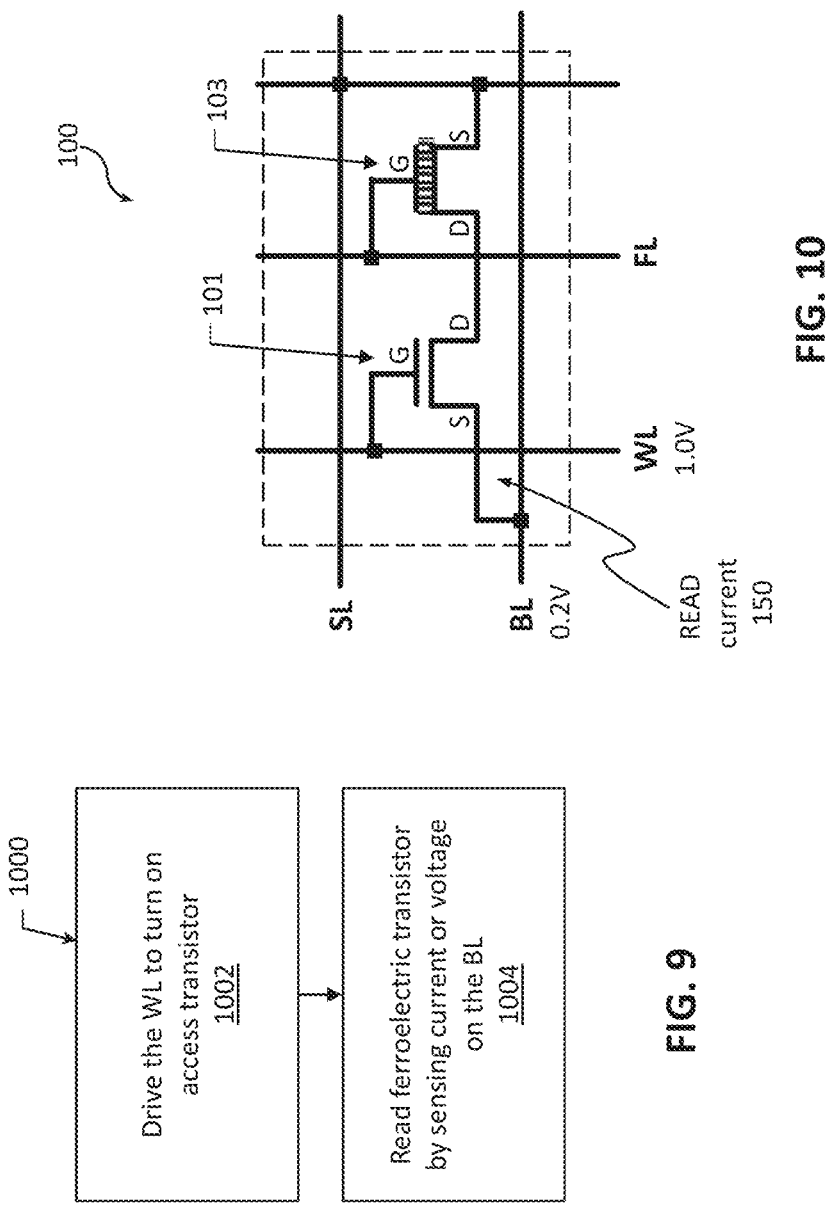

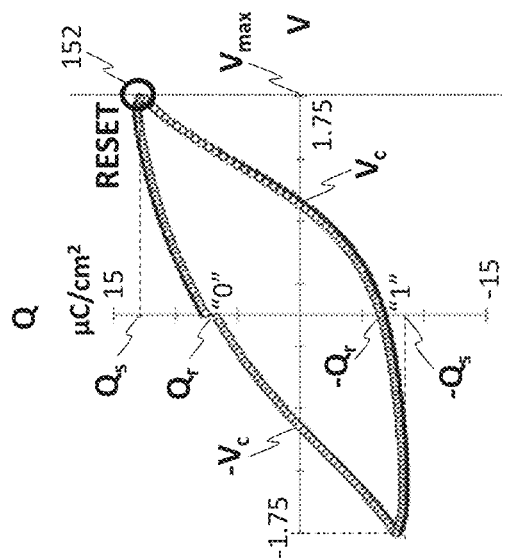
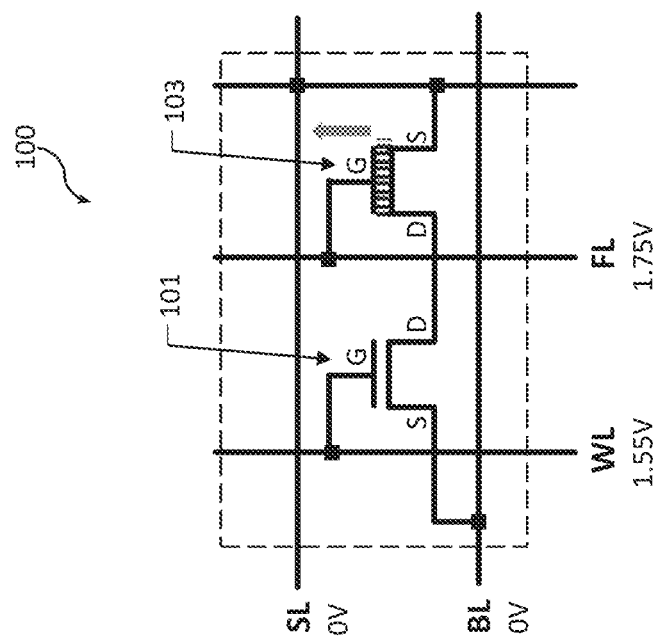
FIG. 12A
FIG. 12B

US 10,998,339 B2

ONE TRANSISTOR AND FERROELECTRIC FET BASED MEMORY CELL

This application is a national stage application under 35 U.S.C. § 371 of PCT International Application Serial No. PCT/US2016/066056, filed Dec. 12, 2016, titled "ONE TRANSISTOR AND FERROELECTRIC FET BASED MEMORY CELL." The disclosure of this application is considered part of (and is incorporated by reference in) the disclosure of this application.

BACKGROUND

Dense low power embedded memory is used in many different computer products. Non-volatile operation by embedded memory is a desirable attribute to reduce standby power. However, known memories do not provide non-volatility, low power, and high switching speeds in one type of memory. For example, Static Random Access Memory (SRAM) is a high speed volatile memory but it consumes leakage power from an always-on power supply. Embedded Dynamic Random Access Memory (E-DRAM) is another high speed volatile memory that consumes dynamic power from refresh operations.

Lower standby power is exhibited by some non-volatile memories. For example, embedded Flash (eFlash), Magnetic Random Access Memory (MRAM), and Resistive Random Access Memory (RRAM) are non-volatile memories that exhibit low standby power but are unlikely to reach the performance level (i.e., SRAM comparable fast read and write operations at low power) required for many applications. Further, endurance of current non-volatile memories is low and write energy too high.

Improvements on one or more challenges described above are always desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 9 is a flow diagram of an example method for reading a 1T-1FE-FET memory cell, in accordance with various embodiments.

FIG. 10 is a schematic illustration of a 1T-1FE-FET memory cell with an indication of READ current, according to some embodiments of the present disclosure.

FIG. 12A is a schematic illustration of a 1T-1FE-FET memory cell with an indication of exemplary voltages in a RESET phase of a WRITE operation, according to some embodiments of the present disclosure.

FIG. 12B is a schematic illustration of a hysteresis loop for a 1T-1FE-FET memory cell with an indication of an exemplary RESET state, according to some embodiments of the present disclosure.

DETAILED DESCRIPTION

Figure 1:
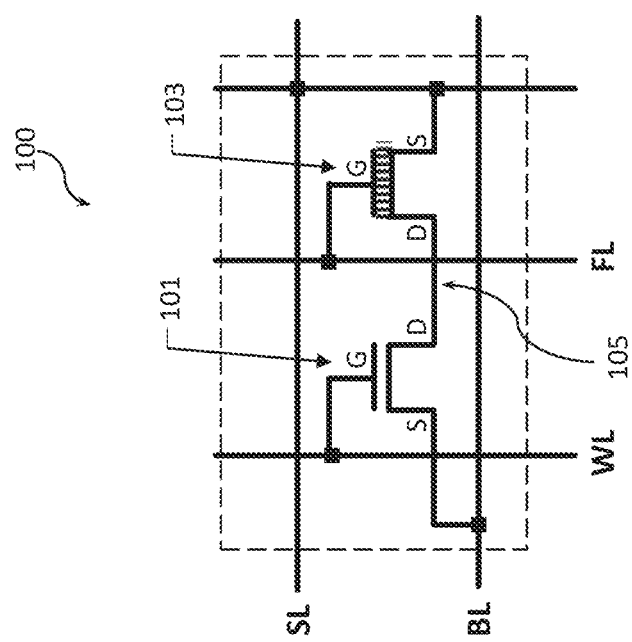
FIG. 1 is a schematic illustration of a 1T-1FE-FET memory cell, according to some embodiments of the present disclosure.

Described herein are ferroelectric memory cells and corresponding methods and devices. Ferroelectric memory refers to a memory technology employing ferroelectric materials. A ferroelectric material is a material that exhibits, over some range of temperatures, a spontaneous electric polarization, i.e. displacement of positive and negative charges from their original position, that can be reversed or reoriented by application of an electric field. Because the displacement of the charges in ferroelectric materials can be maintained for some time even in the absence of an electric field, such materials may be used to implement memory cells. The term "ferroelectric" is said to be adopted to convey the similarity of ferroelectric memories to conventional ferromagnetic memories, despite the fact that there is no iron (Fe) in ferroelectric materials.

Ferroelectric memories have the potential for adequate non-volatility, short programming time, low power consumption, high endurance, and high speed writing. In addition, ferroelectric memories may be manufactured using processes compatible with the standard complementary metal-oxide-semiconductor (CMOS) technology. Therefore, over the last few years, these types of memories have emerged as promising candidates for many growing applications such as e.g. digital cameras and contactless smart cards.

The performance of a ferroelectric memory cell may depend on the number of factors. One factor is the ability of a cell to prevent or minimize detrimental effects of voltages which may unintentionally disturb a polarization state that a cell is supposed to hold. Unlike ferromagnetic cores which have square-like hysteresis loops with sharp transitions around their coercive points, as is desirable for memory implementations, hysteresis loops of ferroelectric materials do not have sharp transitions which means that even relatively small voltages can inadvertently disturb their polarization states. One approach to address this issue could be to improve processing techniques for creating ferroelectric materials in an attempt to create materials having square-like hysteresis loops. Another approach is to overcome this shortcoming of the materials with employing creative circuit architectures, e.g. by using access transistors to control access to ferroelectric cells.

A ferroelectric memory cell disclosed herein includes one access transistor and one ferroelectric transistor and, may, therefore, be referred to as 1T-1FE-FET cell or bit-cell. The access transistor is coupled to the ferroelectric transistor by sharing its source/drain terminal with that of the ferroelectric transistor and is used for both READ and WRITE access to the ferroelectric transistor. Such a circuit architecture may achieve one or more of a number of advantages. The access transistor as described herein helps removing or minimizing disturbances to the polarization state of the memory cell. Compared to other memory cells employing ferroelectric transistors, FE-FET cells, higher density and higher immunity to disturbances may be achieved and the need to have an additional WRITE access transistor is eliminated. Compared to one transistor and one capacitor memory cells, 1T-1C cells, process scalability is increased. Sharing the source/drain terminal of the access transistor with the source/drain terminal of the ferroelectric transistor allows increasing density of memory cells in a memory array. Densities as much as 3 times those of SRAM may be achieved, while advantageously ensuring similar performance and ultra-low standby power. Compared to Flash memories, 1T-1FE-FET may achieve high endurance at relatively low voltages. Endurance of 1T-FE-FET is also high compared to resistive memories, and, in addition, compared to resistive memories, energy required for a WRITE operation in a 1T-1FE-FET is decreased and logic process compatibility is improved.

There are many other possible technical effects of the 1T-1FE-FET memory cell. For example, compared to a 3T-eDRAM bit-cell, the 1T-1FE-FET bit-cell of some embodiments does not require tight leakage tolerances because retention time is set by the relaxation of the ferroelectric polarization and not by subthreshold or gate leakage. As such, significantly less frequent refresh operations or no refresh operations are performed for the 1T-1FE-FET memory cell which lowers the dynamic refresh power consumption of the 1T-1FE-FET compared to the 3T-eDRAM or conventional eDRAM (1T-1C). The 1T-1FE-FET SRAM bit-cell allows for fast read and write operations. For example, the 1T-1FE-FET bit-cell has read and write operations faster than the simplest of the DRAM bit-cells (i.e., one transistor and one capacitor (1T-1C) DRAM bit-cell) due to low cell capacitance during write operation and a read operation which is not limited by bit-cell to bit-line charge-sharing. Other technical effects will be evident from various embodiments described here.

The 1T-1FE-FET memory cell arrangements described herein may be implemented in one or more components associated with an integrated circuit (IC) or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. The meaning of "a," "an," and "the" include plural references. The meaning of "in" includes "in" and "on."

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. The terms "substantially," "close," "approximately," "near," and "about," generally refer to being within +/−20% of a target value. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. For example, as used herein, a "logic state" of a ferroelectric memory cell refers to one of a finite number of states that the cell can have, e.g. logic states "1" and "0," each state represented by a different polarization of the ferroelectric material of the cell. In another example, as used herein, a "READ" and "WRITE" memory access or operations refer to, respectively, determining/sensing a logic state of a memory cell and programming/setting a logic state of a memory cell. In other examples, the term "connected" means a direct electrical or magnetic connection between the things that are connected, without any intermediary devices, while the term "coupled" means either a direct electrical or magnetic connection between the things that are connected or an indirect connection through one or more passive or active intermediary devices. The term "circuit" means one or more passive and/or active components that are arranged to cooperate with one another to provide a desired function. In yet another example, a "high-k dielectric" refers to a material having a higher dielectric constant (k) than silicon oxide.

FIG. 1 is a schematic illustration of a 1T-1FE-FET memory cell 100 according to some embodiments of the present disclosure. As shown, the 1T-1FE-FET cell 100 may include an access transistor 101 and a ferroelectric transistor 103, each having a gate terminal, a source terminal, and a drain terminal, indicated in the example of FIG. 1 as terminals G, S, and D, respectively.

As shown in FIG. 1, in the 1T-1FE-FET cell 100, the gate terminal of the access transistor 101 is coupled to a word-line (WL), the gate terminal of the ferroelectric transistor 103 is coupled to a ferroelectric-line (FL), one of the source or drain terminals of the access transistor 101 is coupled to a bit-line (BL), one of the source or drain terminals of the ferroelectric transistor 103 is coupled to a source-line (SL). The functionality of the WL, BL, FL, and SL is described in greater detail below.

As also shown in FIG. 1, the remaining one of the source or drain terminal of the access transistor 101 is coupled to the remaining one of the source or drain terminal of the ferroelectric transistor 103.

An intermediate node 105, described in greater detail below, refers to the source or drain terminals of the access transistor 101 that is coupled to the source or drain terminal of the ferroelectric transistor 103, as indicated in FIG. 1.

As is commonly known, source and drain terminals are interchangeable in transistors. Therefore, while the example of FIG. 1 illustrates that the transistors 101 and 103 are coupled by their drain terminals, in other embodiments, any one of a source or a drain terminal of the transistor 101 may be coupled to any one of a source or a drain terminal of the transistor 103. A source and a drain terminal of a transistor is sometimes referred to in the following as a "transistor terminal pair" and a "first terminal" of a transistor terminal pair is used to describe, for the access transistor 101, the terminal that is connected to the BL, and, for the ferroelectric transistor 103, the terminal that is connected to the SL. The terminals connecting these two transistors are, consequently, referred to as "second terminals" of each transistor terminal pair.

In various embodiments, either the source or the drain terminals of both transistors can be a "first terminal" of a transistor terminal pair. Thus, in various embodiments, the ferroelectric transistor 103 and the access transistor 101 can be coupled to, respectively, the SL and the BL in one of the four possible ways: A1) by having a source terminal of the ferroelectric transistor being coupled to the SL and a source terminal of the access transistor being coupled to the BL, A2) by having a drain terminal of the ferroelectric transistor being coupled to the SL and a source terminal of the access transistor being coupled to the BL, A3) by having a source terminal of the ferroelectric transistor being coupled to the SL and a drain terminal of the access transistor being coupled to the BL, or A4) by having a drain terminal of the ferroelectric transistor being coupled to the SL and a drain terminal of the access transistor being coupled to the BL.

Similarly, in various embodiments, either the source or the drain terminals of both transistors can be a "second terminal" of a transistor terminal pair, as long as it is the terminal which is not the "first terminal" of the pair. Thus, in various embodiments, the ferroelectric transistor 103 can be coupled to the access transistor 101 in one of the four possible ways: B1) by having a drain terminal of the ferroelectric transistor being coupled to a drain terminal of the access transistor, B2) by having a source terminal of the ferroelectric transistor being coupled to a drain terminal of the access transistor, B3) by having a drain terminal of the ferroelectric transistor being coupled to a source terminal of the access transistor, or B4) by having a source terminal of the ferroelectric transistor being coupled to a source terminal of the access transistor. Each of the four possible combinations B1-B4 for how the ferroelectric transistor 103 can be coupled to the access transistor 101 corresponds to one of the four possible combinations A1-A4 for how the ferroelectric transistor 103 and the access transistor 101 can be coupled to the SL and the BL. In the listings for combinations A and B provided herein, the combinations from A and B having the same reference numeral correspond to one another (i.e. implemented together)—e.g. A1 corresponds to B1, A2 corresponds to B2, and so on.

As described in greater detail below, the ferroelectric transistor 103 includes a ferroelectric capacitor, also referred to as the ferroelectric material or ferroelectric element. In some embodiments, the ferroelectric material of the transistor 103 is programmable via the WL and the FL. In some embodiments, the ferroelectric material is integrated within the gate terminal of the transistor 103, which transistor may also be referred to as the ferroelectric gain transistor. For example, the gate terminal of the transistor 103 may be or include a ferroelectric gate stack (i.e. a gate stack including a ferroelectric material) providing a function of a ferroelectric capacitor.

In some embodiments, the access transistor 101, controllable by the WL, may also be a ferroelectric transistor.

In various embodiments, the transistors described herein, such as e.g. the transistors 101 and 103, may be any metal oxide semiconductor (MOS) transistors which include drain, source, and gate terminals. Embodiments of the present disclosure are explained below with reference to field-effect transistors (FET). However, in other embodiments, other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.). Furthermore, in various embodiments, transistors described herein can have planar or non-planar architecture, as suitable for a particular implementation. Recently, transistors with non-planar architecture, such as e.g. tri-gate and all-around gate transistors, have been extensively explored as promising alternatives to transistors with planar architecture. Therefore, embodiments of the present disclosure are explained below and illustrated with reference, but are not limited, to tri-gate transistors and all-around-gate transistors.

Tri-gate transistors refer to transistors having a non-planar architecture where a fin, formed of one or more semiconductor materials, extends away from a base. The name "tri-gate" originates from the fact that, in use, such a transistor may form conducting channels on three "sides" of the fin. Tri-gate transistors potentially improve performance relative to single-gate transistors and double-gate transistors.

In a tri-gate transistor, sides of a portion of a fin that is closest to a base are enclosed by a dielectric material, typically an oxide, commonly referred to as a "shallow trench isolation" (STI). A gate stack that includes a stack of one or more gate electrode metals and a stack of one or more gate dielectrics is provided over the top and sides of the remaining upper portion of the fin (i.e. the portion above the STI), thus wrapping around the upper portion of the fin and forming a three-sided gate of a tri-gate transistor. The portion of the fin that is enclosed by the STI is referred to as a "sub-fin" while the portion of the fin over which the gate stack wraps around is referred to as a "active portion." A semiconductor material of which a channel portion of the fin is formed is commonly referred to as a "channel material." A source region and a drain region are provided on either side of the gate stack, forming, respectively, a source and a drain of such a transistor.

All-around-gate transistors refer to transistors having a non-planar architecture where a wire, formed of a semiconductor material, is provided over a substrate. The semiconductor material of the wire is commonly referred to as a "channel material" because conducting channels of an all-around-gate transistor are formed within the wire. All-around-gate transistors potentially improve performance relative to tri-gate transistors because such transistors may form conducting channels on more than three "sides" of the wire.

In an all-around-gate transistor, a gate stack that includes a stack of gate electrode metal(s) and a stack of gate dielectric(s) wraps around the wire, e.g. forming a four-sided gate of an all-around-gate transistor in case the wire has a rectangular cross-section. In various embodiments, a cross-section of a wire can have any shape besides a rectangular shape. A source region and a drain region are provided on the opposite ends of the wire, on either side of the gate stack, forming, respectively, a source and a drain of such a transistor.

Figure 2:
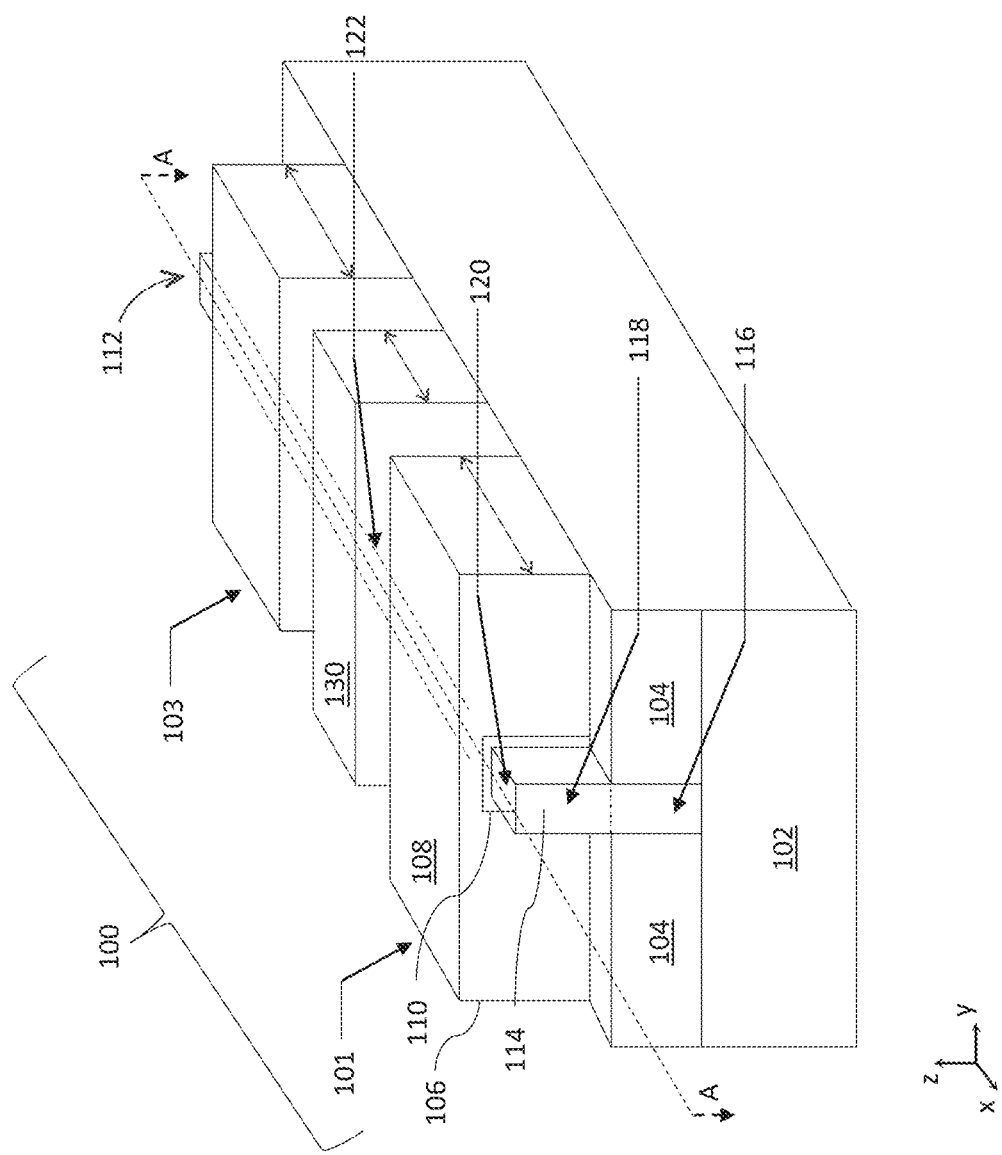
FIG. 2 is a perspective view of an example 1T-1FE-FET memory cell arrangement with two tri-gate transistors, according to some embodiments of the present disclosure.

FIG. 2 is a perspective view of an example 1T-1FE-FET memory cell arrangement 100 with two tri-gate transistors, according to some embodiments of the present disclosure. In some embodiments, the two tri-gate transistors 101 and 103 shown in FIG. 2 may be substantially identical, except for the presence of a ferroelectric material in the transistor 103 and absence of such a material in the transistor 101. In other embodiments, the two tri-gate transistors 101 and 103 shown in FIG. 2 may be substantially identical and both include the ferroelectric material as described herein. Therefore details of only one of these transistors is described and labeled with reference numerals in FIG. 2, namely the access transistor 101. The ferroelectric transistor 103 is then described by referring to the similarities to and difference(s) from the access transistor 101.

Although a single memory cell 100 is illustrated in FIG. 2, this is also simply for ease of illustration, and any greater number of memory cells 100 may be provided along a single fin according to various embodiments of the present disclosure. Furthermore, note that the arrangement shown in FIG. 2 is intended to show relative arrangements of some of the components therein, and that the arrangement with the memory cell 100, or portions thereof, may include other components that are not illustrated (e.g., electrical contacts to the source and the drain of the transistors 101 and 103, additional layers such as e.g. a spacer layer, around the gate electrode of the transistors 101 and 103, etc.).

As shown, the tri-gate access transistor 101, as well as the tri-gate ferroelectric transistor 103, of FIG. 2 may include a base 102, a transistor dielectric material 104, and a gate stack 106 comprising a gate electrode material 108 (which could include a stack of one or more gate electrode materials) and a gate dielectric 110 (which could include a stack of one or more gate dielectric materials). In the tri-gate transistors 101 and 103 illustrated in FIG. 2, a fin 112 formed of a semiconductor material 114 may extend from the base 102, with the two transistors 101 and 103 sharing the fin by being provided over different portions of the fin.

In general, implementations of the present disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which a semiconductor device may be built falls within the spirit and scope of the present disclosure. In various embodiments the base 102 may include any such substrate that provides a suitable surface for providing the arrangement having the memory cell 100.

The transistor dielectric material 104 forms an STI disposed on either side of the fin 112. A portion of the fin 112 enclosed by the STI 104 forms a sub-fin 116. The STI material 104 may be a high-k dielectric including elements such as hafnium, silicon, oxygen, titanium, tantalum, lanthanum, aluminum, zirconium, barium, strontium, yttrium, lead, scandium, niobium, and zinc. Examples of high-k materials that may be used in the STI material 104 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

The gate stack 106 may wrap around the fin 112 as shown, with a channel portion 118 corresponding to the portion of the fin 112 wrapped by the gate stack 106. In particular, the gate dielectric 110 may wrap around the fin 112, and the gate electrode material 108 may wrap around the gate dielectric 110. The horizontal dashed line shown on the front end face of the fin 112 is intended to illustrate the division between the channel portion 118 and the sub-fin 116, i.e. the interface between the channel portion 118 and the sub-fin portion 116 is located proximate to where the gate electrode 108 ends, which is typically where the STI 104 begins.

The gate electrode material 108 may include at least one P-type work function metal or N-type work function metal, depending on whether the transistor 101/103 is a P-type metal oxide semiconductor (PMOS) transistor or an N-type metal oxide semiconductor (NMOS) transistor (P-type work function metal used as the gate electrode 108 when the transistors 101/103 is a PMOS transistor and N-type work function metal used as the gate electrode 108 when the transistor 101/103 is an NMOS transistor). For a PMOS transistor, metals that may be used for the gate electrode material 108 may include, but are not limited to, ruthenium, palladium, platinum, cobalt, nickel, and conductive oxygen containing metallic materials such as metal oxides (e.g., ruthenium oxide). For an NMOS transistor, metals that may be used for the gate electrode material 108 include, but are not limited to, hafnium, zirconium, titanium, tantalum, aluminum, alloys of these metals, as well as combinations of these metals with carbon such as carbides of these metals (e.g., hafnium carbide, zirconium carbide, titanium carbide, tantalum carbide, and aluminum carbide). In some embodiments, the gate electrode material 108 may consist of a stack of two or more metal layers, where one or more metal layers are work function metal layers and at least one metal layer is a fill metal layer. Further layers may be included next to the gate electrode material 108 for other purposes, such as to act as a diffusion barrier layer or/and an adhesion layer.

In some embodiments, the gate dielectric 110 may include one or more high-k dielectrics including any of the materials discussed herein with reference to the STI material 104. In some embodiments, an annealing process may be carried out on the gate dielectric 110 during manufacture of the transistor 101/103 to improve the quality of the gate dielectric 110. The gate dielectric 110 may have a thickness, a dimension measured in the direction of the y-axis of the reference coordinate system x-y-z shown in FIG. 2, that may, in some embodiments, be between 0.5 nanometers and 3 nanometers, including all values and ranges therein (e.g., between 1 and 3 nanometers, or between 1 and 2 nanometers). In some embodiments, the gate stack 106 may be surrounded by a gate spacer, not shown in FIG. 2, but shown in the cross-sectional view of FIG. 3 as a gate spacer 111. The gate spacer 111 is configured to provide separation between the gate stack 106 and source/drain contacts of a transistor and typically is made of a low-k dielectric material (i.e. a dielectric material that has a lower dielectric constant than silicon dioxide).

The gate stack 106 of the ferroelectric transistor 103 further includes a ferroelectric material 124 (not specifically shown in the perspective view of FIG. 2 but shown in the cross-sectional views of FIGS. 3 and 4) in addition to the gate electrode metal 108, which is what makes the transistor 103 a ferroelectric transistor. While FIGS presented herein provide exemplary illustrations of embodiments where the ferroelectric material 124 is provided in addition to the gate dielectric 110 of the gate stack, in other embodiments, such a material may replace the gate dielectric 110, all of which embodiments being within the scope of the present disclosure.

The ferroelectric material 124 may include one or more materials which exhibit sufficient ferroelectric behavior even at thin dimensions as typically used in scaled logic transistors as the ones illustrated here. Some examples of such materials known at the moment include hafnium zirconium oxide (HfZrO, also referred to as HZO, which includes hafnium, zirconium, and oxygen), silicon-doped (Si-doped) hafnium oxide (which is a material that includes hafnium, oxygen, and silicon), germanium-doped (Ge-doped) hafnium oxide (which is a material that includes hafnium, oxygen, and germanium), aluminum-doped (Al-doped) hafnium oxide (which is a material that includes hafnium, oxygen, and aluminum), and yttrium-doped (Y-doped) hafnium oxide (which is a material that includes hafnium, oxygen, and yttrium). However, in other embodiments, any other materials which exhibit ferroelectric behavior at thin dimensions may be used as the material 124 and are within the scope of the present disclosure. The ferroelectric material 124 may have a thickness, a dimension measured in the direction of the y-axis of the reference coordinate system x-y-z shown in FIG. 2, that may, in some embodiments, be between 0.5 nanometers and 10 nanometers, including all values and ranges therein (e.g., between 1 and 8 nanometers, or between 0.5 and 5 nanometers).

Even though not specifically shown in FIGS. of the present disclosure, in some embodiments, the access transistor 101 may also be a ferroelectric transistor, i.e. it may have the ferroelectric material layer such as the ferroelectric material 124 described herein.

The material of the fin 112 may be composed of semiconductor material systems including, for example, N-type or P-type materials systems. In some embodiments, the fin material may include a high mobility oxygen containing semiconductor materials such as semiconductor oxides, e.g. tin oxide, antimony oxide, indium oxide, indium tin oxide, titanium oxide, zinc oxide, indium zinc oxide, gallium oxide, titanium oxynitride, ruthenium oxide, or tungsten oxide. The fin material may include a combination of semiconductor materials where one semiconductor material is used for the channel portion 118 of the fin 112 and another material, sometimes referred to as a "blocking material," is used for the sub-fin 116. Such a blocking material is used sometimes to reduce or eliminate sub-fin leakage, an undesirable phenomenon when some of the current is conducted in the sub-fin. In some embodiments, the sub-fin 116 and the channel portion 118 are each formed of monocrystalline semiconductors. In a first embodiment, the sub-fin 116 and the channel portion 118 are each formed of compound semiconductors with a first sub-lattice of at least one element from group III of the periodic table (e.g., Al, Ga, In), and a second sub-lattice of at least one element of group V of the periodic table (e.g., P, As, Sb). The sub-fin 116 may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth. For exemplary N-type transistor embodiments, the channel portion 118 is advantageously a III-V material having a high electron mobility, such as, but not limited to InGaAs, InP, InSb, and InAs. For some such embodiments, the channel portion 118 is a ternary III-V alloy, such as InGaAs or GaAsSb. For some $In_xGa_{1-x}As$ fin embodiments, In content (x) is between 0.6 and 0.9, and advantageously is at least 0.7 (e.g., $In_{0.7}Ga_{0.3}As$). In some embodiments with highest mobility, the channel portion 118 is intrinsic III-V material and not intentionally doped with any electrically active impurity. In alternate embodiments, a nominal impurity dopant level may be present within the channel portion 118, for example to set a threshold voltage Vt, or to provide HALO pocket implants, etc. Even for impurity-doped embodiments however, impurity dopant level within the channel portion 118 is relatively low, for example below $10^{15}$ cm$^{-3}$, and advantageously below $10^{13}$ cm$^{-3}$. The sub-fin 116 is advantageously a III-V material having a significant band offset (e.g., conduction band offset for N-type devices) from the channel portion 118. Exemplary materials, include, but are not limited to, GaAs, GaSb, GaAsSb, GaP, InAlAs, GaAsSb, AlAs, AlP, AlSb, and AlGaAs. In some N-type transistor embodiments where the channel portion 118 is InGaAs, the sub-fin 116 is GaAs, and may also be doped with impurities (e.g., p-type) to a greater impurity level than the channel portion 118. In an alternate heterojunction embodiment, the sub-fin 116 and the channel portion 118 are each group IV semiconductors (e.g., Si, Ge, SiGe). The sub-fin 116 may be a first elemental semiconductor (e.g., Si or Ge) or a first SiGe alloy (e.g., having a wide bandgap). For exemplary P-type transistor embodiments, the channel portion 118 is advantageously a group IV material having a high hole mobility, such as, but not limited to Ge or a Ge-rich SiGe alloy. For some exemplary embodiments, the channel portion 118 has a Ge content between 0.6 and 0.9, and advantageously is at least 0.7. In some embodiments with highest mobility, the channel portion 118 is intrinsic III-V (or IV for P-type devices) material and not intentionally doped with any electrically active impurity. In alternate embodiments, one or more nominal impurity dopant level may be present within the channel portion 118, for example to set a threshold voltage Vt, or to provide HALO pocket implants, etc. Even for impurity-doped embodiments however, impurity dopant level within the channel portion 118 is relatively low, for example below $10^{15}$ cm$^{-3}$, and advantageously below $10^{13}$ cm$^{-3}$. The sub-fin 116 may advantageously be a group IV material having a significant band offset (e.g., valance band offset for P-type devices) from the fin. Exemplary materials, include, but are not limited to, Si or Si-rich SiGe. In some P-type transistor embodiments, the sub-fin 116 is Si and may also be doped with impurities (e.g., n-type) to a higher impurity level than the channel portion 118.

Figures 3, 4:
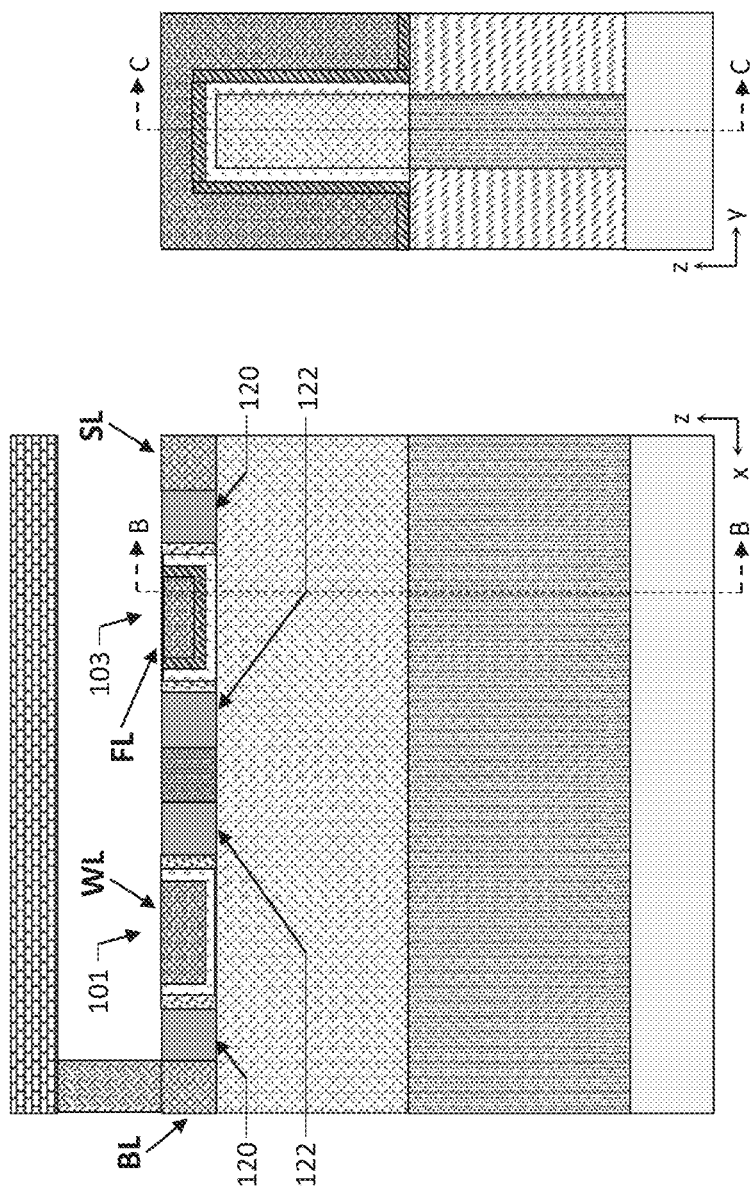
FIG. 3 is a cross-sectional side view along a plane AA of the example arrangement shown in FIG. 2, according to some embodiments of the present disclosure.
FIG. 4 is a cross-sectional side view along a plane BB of the example arrangement shown in FIG. 3, according to some embodiments of the present disclosure.

The fin 112 may include a source region and a drain region on either side of the gate stack 106, as shown, thus realizing a transistor. As is well known in the art, source and drain regions are formed for the gate stack of each MOS transistor. As described above, the source and drain regions of a transistor are interchangeable, and a nomenclature of a first terminal and a second terminal of a terminal transistor pair has been introduced for use in the present disclosure. In FIGS. 2-4, reference numeral 120 is used to label the first terminal and reference numeral 122 is used to label the second terminal of each terminal transistor pair of source/drain terminals as described herein. Thus, for the access transistor 101, the source/drain terminal, or region, 120 is the source or the drain terminal/region that is coupled to the BL, while, for the ferroelectric transistor 103, the source/drain terminal/region 120 is the source or the drain terminal/region that is coupled to the SL.

The source and drain regions of the transistors 101/103 may generally be formed using either an implantation/diffusion process or an etching/deposition process. In the former process, dopants such as boron, aluminum, antimony, phosphorous, or arsenic may be ion-implanted into the channel material to form the source and drain regions. An annealing process that activates the dopants and causes them to diffuse further into the fin 112 typically follows the ion implantation process. In the latter process, the fin 112 may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions. Any of the-above described materials, and other materials as known in the art, forming the source and the drain regions 120/122 are referred to herein, in general, as electrically conductive materials 140, shown e.g. in FIG. 3.

Each of the transistors 101/103 may have a gate length (i.e. a distance between the terminals 120 and 122 of the transistor terminal pair of the transistor 101/103), a dimension measured along the fin 112, in the direction of the x-axis of an exemplary reference coordinate system x-y-z shown in FIG. 2, which may, in some embodiments, be between 20 and 40 nanometers, including all values and ranges therein (e.g. between 22 and 35 nanometers, or between 20 and 30 nanometers). The fin 112 may have a thickness, a dimension measured in the direction of the y-axis of the reference coordinate system x-y-z shown in FIG. 2, that may, in some embodiments, be between 5 and 30 nanometers, including all values and ranges therein (e.g. between 7 and 20 nanometers, or between 10 and 15 nanometers). The fin 112 may have a height, a dimension measured in the direction of the z-axis of the reference coordinate system x-y-z shown in FIG. 2, which may, in some embodiments, be between 30 and 350 nanometers, including all values and ranges therein (e.g. between 30 and 200 nanometers, between 75 and 250 nanometers, or between 150 and 300 nanometers).

Although the fin 112 illustrated in FIG. 2 is shown as having a rectangular cross section in a z-y plane of the reference coordinate system shown in FIG. 2, the fin 112 may instead have a cross section that is rounded or sloped at the "top" of the fin 112, and the gate stack 106 may conform to this rounded or sloped fin 112. In use, the tri-gate transistors 101/103 may form conducting channels on three "sides" of the fin 112, potentially improving performance relative to single-gate transistors (which may form conducting channels on one "side" of a fin or substrate) and double-gate transistors (which may form conducting channels on two "sides" of a fin or substrate).

As shown in the memory cell 100 illustrated in FIG. 2, in some embodiments, optionally, a contact structure 130 may be provided between the access transistor 101 and the ferroelectric transistor 103. More specifically, the contact structure 130 may be provided between the second terminal 122 of the transistor terminal source/drain pair of the access transistor 101 and the second terminal 122 of the transistor terminal source/drain pair of the ferroelectric transistor 103. The contact structure 130 may serve as an optional contact metal point between the access transistor 101 and the ferroelectric transistor 103. Such a contact structure may enhance the manufacturability of the bitcell 100 by providing a more regular (or repetitious) structure amenable to advanced patterning, etch and polish processes. The structure 130 may be formed of any material suitable for forming an interconnect, such as e.g. tungsten, aluminum, or copper. The contact structure 130 may be provided substantially perpendicular to the base 102 and substantially parallel to the gate electrodes 108 of the transistors 101/103.

FIGS. 3 and 4 are cross-sectional views of the arrangement with the 1T-1FE-FET memory cell 100 shown in FIG. 2, in accordance with various embodiments. In particular, FIG. 3 illustrates a cross-section of the memory cell 100 taken along the section A-A of FIG. 2 (i.e. the x-z plane of the reference coordinate system shown in FIG. 2), while FIG. 4 illustrates a cross-section of the memory cell 100 taken along the section B-B of FIG. 3 (i.e. the z-y plane of the reference coordinate system shown in FIG. 2; at the same time FIG. 3 illustrates a cross-section of the memory cell 100 taken along the section C-C of FIG. 4). Thus, cross-sectional views taken along the section A-A of FIG. 2 and along the section C-C of FIG. 4 are the same—the view of FIG. 3. A number of elements labeled in FIG. 2 with reference numerals are indicated in FIGS. 3 and 4 with different patterns, with a legend showing the correspondence between the reference numerals and patterns being provided at the bottom of FIGS. 3 and 4. In particular, the legend illustrates that FIGS. 3 and 4 use different patterns to show the base 102, the STI 104, the gate electrode material 108, the gate dielectric 110, the spacer 111, the sub-fin portion 116 of the fin, the channel portion 118, the ferroelectric material 124 of the ferroelectric transistor 103, the optional contact structure 130, and the electrically conductive material 140 of the source/drain terminals 120/122.

Besides the elements shown in FIG. 2, FIG. 3 illustrates regions to which each of the BL, WL, FL, and SL shown in FIG. 1 are coupled to. Furthermore, FIG. 3 illustrates an electrically conductive material 142 for making the electrical connections to the BL and the SL (even though FIG. 3 illustrates the same material 142 used for both the BL and the SL, in some embodiments, the material 142 for the BL may be different from that used for the SL). In addition, FIG. 4 illustrates a via 144 and a line 146 configured to provide an exemplary illustration of metallization lines which may be implemented.

FIGS. 3 and 4 are intended to provide an illustration of some further details of the arrangement of the 1T-1FE-FET memory cell 100, thus all of the descriptions provided above with respect to reference numerals indicated in FIG. 2 are applicable to FIGS. 3 and 4 and are not repeated.

The transistor shown on the left side of FIG. 3 is the access transistor 101, while the transistor shown on the right side of FIG. 3 is the ferroelectric transistor 103. The illustration of FIG. 3 makes clear that the access transistor 101 and the ferroelectric transistor 103 may be provided over different portions of a single continuous fin 112. The connect structure 130 may be provided between the source/drain region 122 of the access transistor 101 and the source/drain region 122 of the ferroelectric transistor 103.

FIG. 4 illustrates the gate stack 106 wrapping around the fin 112. Namely, because the cross-section of FIG. 4 is taken for the ferroelectric transistor 103 where the ferroelectric material 124 is used, FIG. 4 illustrates the gate dielectric 110 wrapping around the channel portion 118, the ferroelectric material 124 wrapping around the gate dielectric 110, and the gate electrode material 108 wrapping around the ferroelectric material 124. In some embodiments, the gate dielectric 110 may be in contact with the channel portion 118, the ferroelectric material 124 may be in contact with the gate dielectric 110, and the gate electrode material 108 may be in contact with the ferroelectric material 124. A comparison of the views of FIGS. 3 and 4 also reveals that the geometry of the ferroelectric material 124 may conform to that of the gate electrode material 108. If the access transistor 101 was also a ferroelectric transistor, it would have a cross-section as shown in FIG. 4.

Figure 5:
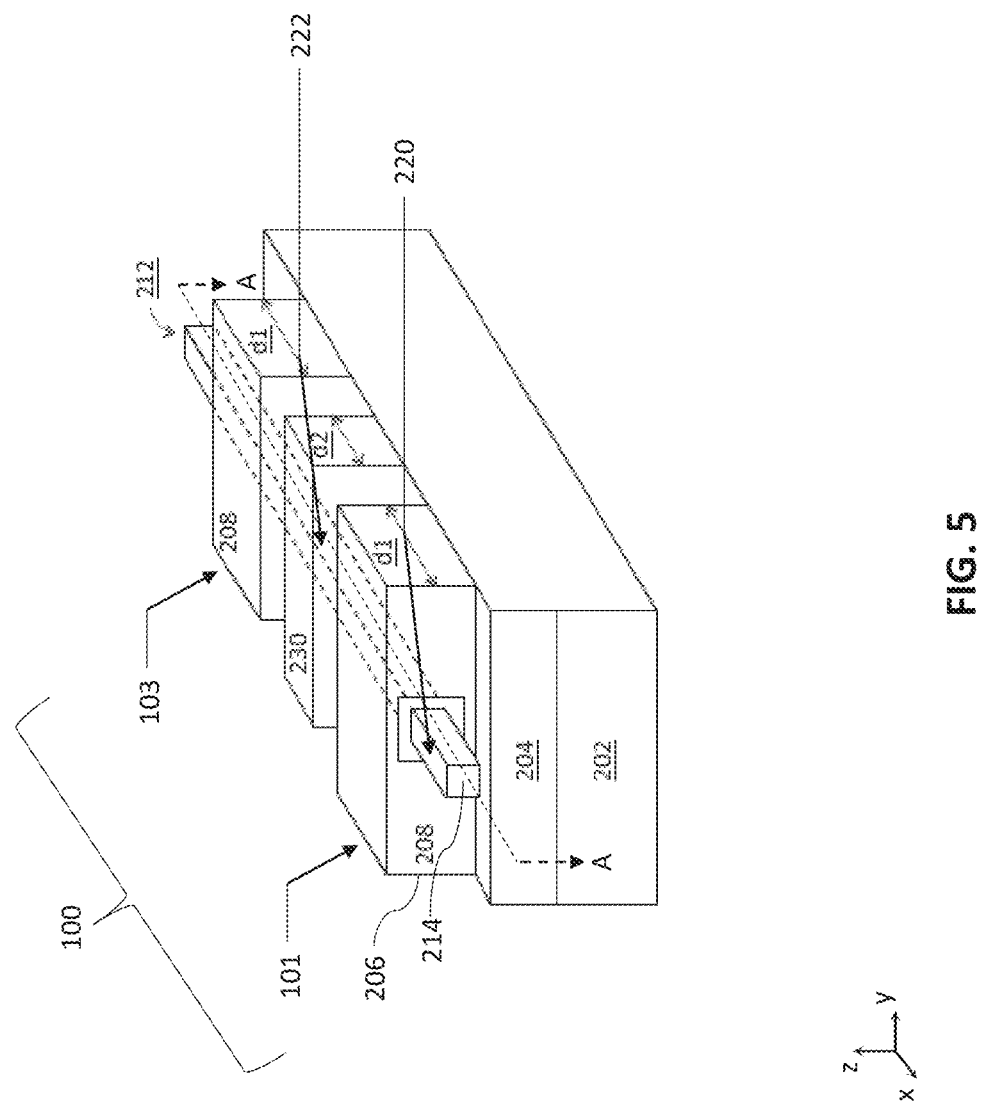
FIG. 5 is a perspective view of an example 1T-1FE-FET memory cell arrangement with two all-around-gate transistors, according to some embodiments of the present disclosure.

FIG. 5 is a perspective view of an arrangement alternative to that shown in FIGS. 2-4 for the 1T-1FE-FET memory cell 100 implemented using two all-around-gate transistors, according to some embodiments of the present disclosure.

The two all-around-gate transistors 101 and 103 shown in FIG. 5 may be substantially identical, except for the presence of a ferroelectric material in the transistor 103. Therefore details of only one of them is described and labeled with reference numerals in FIG. 5, namely the access transistor 101. The ferroelectric transistor 103 is then described by referring to the similarities to and difference(s) from the access transistor 101.

As shown, the all-around-gate transistors 101 and 103 of FIG. 5 may include a substrate 202, an optional intermediate layer 204, and a gate stack 206 comprising a gate electrode material 208 and a gate dielectric 210. In some embodiments, the gate stack 206 may be surrounded by a gate spacer, not shown in FIG. 5, but shown in the cross-sectional view of FIG. 6 as a gate spacer 211. Unless described otherwise, discussions regarding the substrate 102, the gate stack 106, the gate electrode material 108, the gate dielectric 110, and the gate spacer 111 provided above are applicable to the substrate 202, the gate stack 206, the gate electrode material 208, the gate dielectric 210, and the gate spacer 211, respectively, and, therefore, in the interests of brevity, are not repeated.

Unlike the fin 112 that extends away from the base in the arrangement shown in FIG. 2, the arrangement shown in FIG. 5 includes a wire 212 that is provided above the substrate and the intermediate layer 204. Thus, in the all-around-gate transistor 201 illustrated in FIG. 5, a wire 212 formed of a semiconductor material 214 (or a combination of semiconductor materials) may extend above the substrate 202.

Although a single memory cell 100 is illustrated in FIG. 5, this is simply for ease of illustration, and any greater number of memory cells 100 may be provided along a single wire 212 according to various embodiments of the present disclosure. Furthermore, note that the arrangement shown in FIG. 5 is intended to show relative arrangements of some of the components therein, and that the arrangement with the memory cell 100, or portions thereof, may include other components that are not illustrated (e.g., electrical contacts to the source and the drain of the transistors 101 and 103, additional layers such as e.g. a spacer layer, around the gate electrode of the transistors 101 and 103, etc.).

The wire 212 may take the form of a nanowire or nanoribbon, for example. The gate stack 206 may wrap entirely or almost entirely around the wire 212, as shown, with the channel material 214 corresponding to the portion of the wire 212 wrapped by the gate stack 206. In particular, the gate dielectric 210 may wrap around the channel material 214 of the wire 212, and the gate electrode material 208 may wrap around the gate dielectric 210. The wire 212 may include source/drain regions/terminals 220 and 222 on either side of the gate stack 206, as shown, thus realizing a transistor. The source/drain regions 220 and 222 are analogous to the source/drain regions 120/122 described herein, and may be formed of an electrically conductive material 240 (shown in FIG. 6) analogous to the electrically conductive material 140 described herein. The transistor 201 may have a gate length, measured along the wire 212, in the direction of the x-axis of an exemplary reference coordinate system x-y-z shown in FIG. 5, which may, in some embodiments, be between 20 and 40 nanometers, including all values and ranges therein (e.g. between 22 and 35 nanometers, or between 20 and 30 nanometers). The composition of the substrate, the channel material, the gate dielectric, the gate electrode, the source region and the drain region may take the form of any of the embodiments disclosed herein, or known in the art.

In addition to the gate electrode metal 208 and the gate dielectric 210, the gate stack 206 of the ferroelectric transistor 203 further includes a ferroelectric material 124 as described above (not specifically shown in the perspective view of FIG. 5 but shown in the cross-sectional views of FIGS. 6 and 7), which is what makes the transistor 203 a ferroelectric transistor.

Even though not specifically shown in FIGS. of the present disclosure, in some embodiments, the all-around-gate access transistor 101 may also be a ferroelectric transistor, i.e. it may have the ferroelectric material layer such as the ferroelectric material 124 described herein.

As shown in the memory cell 100 illustrated in FIG. 5, in some embodiments, optionally, a contact structure 230 may be provided between the access transistor 101 and the ferroelectric transistor 103. The contact structure 230 is analogous to the contact structure 130 described above, except that it may completely wrap around the wire 212.

Although the wire 212 illustrated in FIG. 5 is shown as having a rectangular cross-section, the wire 212 may instead have a cross-section that is rounded or otherwise irregularly shaped, and the gate stack 206 and the contact structure 230 may conform to the shape of the wire 212. In use, the all-around-gate transistor 101 may form conducting channels on more than three "sides" of the wire 212, potentially improving performance relative to tri-gate transistors.

Figures 6, 7:
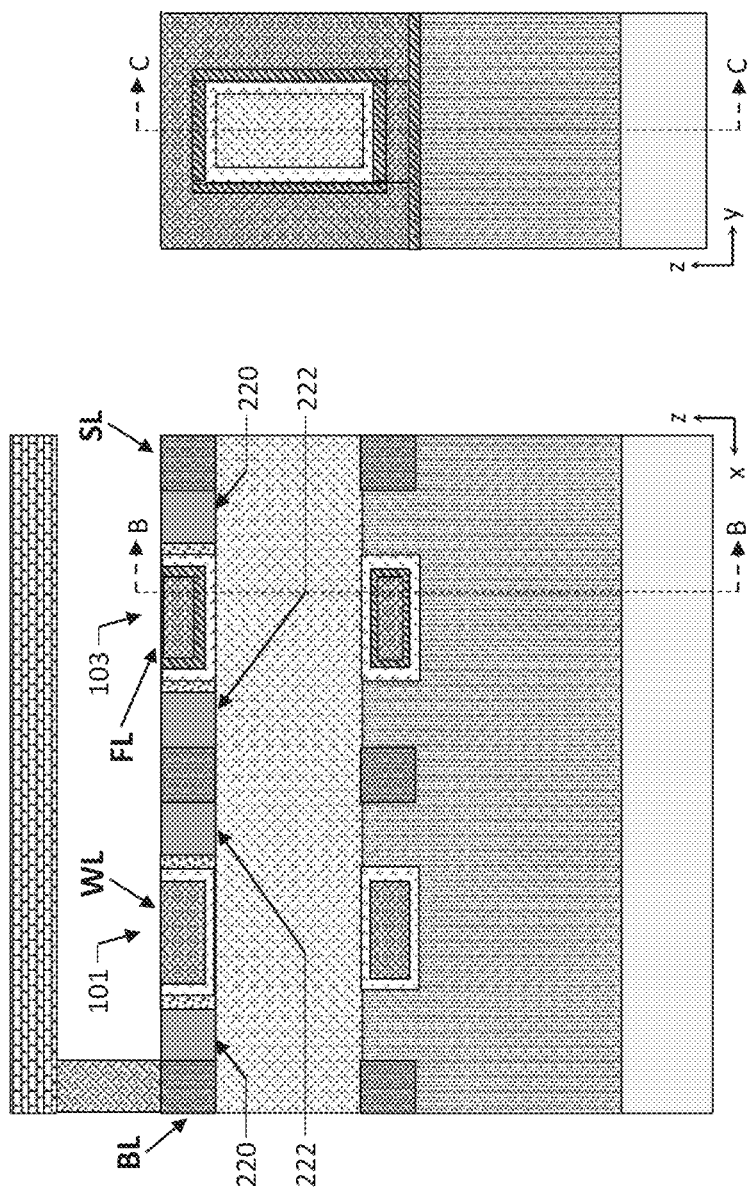
FIG. 6 is a cross-sectional side view along a plane AA of the example arrangement shown in FIG. 5, according to some embodiments of the present disclosure.
FIG. 7 is a cross-sectional side view along a plane BB of the example arrangement shown in FIG. 6, according to some embodiments of the present disclosure.

FIGS. 6 and 7 are cross-sectional views of the arrangement with the 1T-1FE-FET memory cell 100 shown in FIG. 5, in accordance with various embodiments. In particular, FIG. 6 illustrates a cross-section of the memory cell 100 implementing all-around-gate transistors taken along the section A-A of FIG. 5 (i.e. the x-z plane of the reference coordinate system shown in FIG. 5), while FIG. 7 illustrates a cross-section of the memory cell 100 of FIG. 5 taken along the section B-B of FIG. 6 (i.e. the z-y plane of the reference coordinate system shown in FIG. 6; at the same time FIG. 6 illustrates a cross-section of the memory cell 100 taken along the section C-C of FIG. 7). Thus, cross-sectional views taken along the section A-A of FIG. 5 and along the section C-C of FIG. 7 are the same—the view of FIG. 6. A number of elements labeled in FIG. 5 with reference numerals are indicated in FIGS. 6 and 7 with different patterns, with a legend showing the correspondence between the reference numerals and patterns being provided at the bottom of FIGS. 6 and 7. In particular, the legend illustrates that FIGS. 6 and 7 use different patterns to show the base 202, the STI 204, the gate electrode material 208, the gate dielectric 210, the spacer 211, the channel portion 218, the ferroelectric material 124 of the ferroelectric transistor 103, the optional contact structure 230, and the electrically conductive material 240 of the source/drain terminals 220/222.

Besides the elements shown in FIG. 5, FIG. 6 illustrates regions to which each of the BL, WL, FL, and SL shown in FIG. 1 are coupled to. Furthermore, FIG. 6 illustrates an electrically conductive material 242 for making the electrical connections to the BL and the SL (even though FIG. 6 illustrates the same material 242 used for both the BL and the SL, in some embodiments, the material 242 for the BL may be different from that used for the SL). In addition, FIG. 6 illustrates a via 244 and a line 246, analogous to the via 144 and the line 146 described above with reference to FIG. 3.

FIGS. 6 and 7 are intended to provide an illustration of some further details of the arrangement of the 1T-1FE-FET memory cell 100 implemented using all-around-gate transistors, thus all of the descriptions provided above with respect to reference numerals indicated in FIG. 5 are applicable to FIGS. 6 and 7 and are not repeated.

The transistor shown on the left side of FIG. 6 is the access transistor 101, while the transistor shown on the right side of FIG. 6 is the ferroelectric transistor 103. The illustration of FIG. 6 makes clear that the access transistor 101 and the ferroelectric transistor 103 may be provided over different portions of the single continuous wire 212. The connect structure 230 may be provided between the source/drain region 222 of the access transistor 101 and the source/drain region 222 of the ferroelectric transistor 103.

FIG. 7 illustrates the gate stack 206 entirely wrapping around the wire 212. Namely, because the cross-section of FIG. 7 is taken for the ferroelectric transistor 103 where the ferroelectric material 124 is used, FIG. 7 illustrates the gate dielectric 210 wrapping around the channel material 214, the ferroelectric material 124 wrapping around the gate dielectric 210, and the gate electrode material 208 wrapping around the ferroelectric material 124. In some embodiments, the gate dielectric 210 may be in contact with the channel material 214 of the wire 212, the ferroelectric material 124 may be in contact with the gate dielectric 210, and the gate electrode material 208 may be in contact with the ferroelectric material 124. A comparison of the views of FIGS. 6 and 7 also reveals that the geometry of the ferroelectric material 124 may conform to that of the gate electrode material 208. If the access transistor 101 was also a ferroelectric transistor, it would have a cross-section as shown in FIG. 7.

Figure 8:
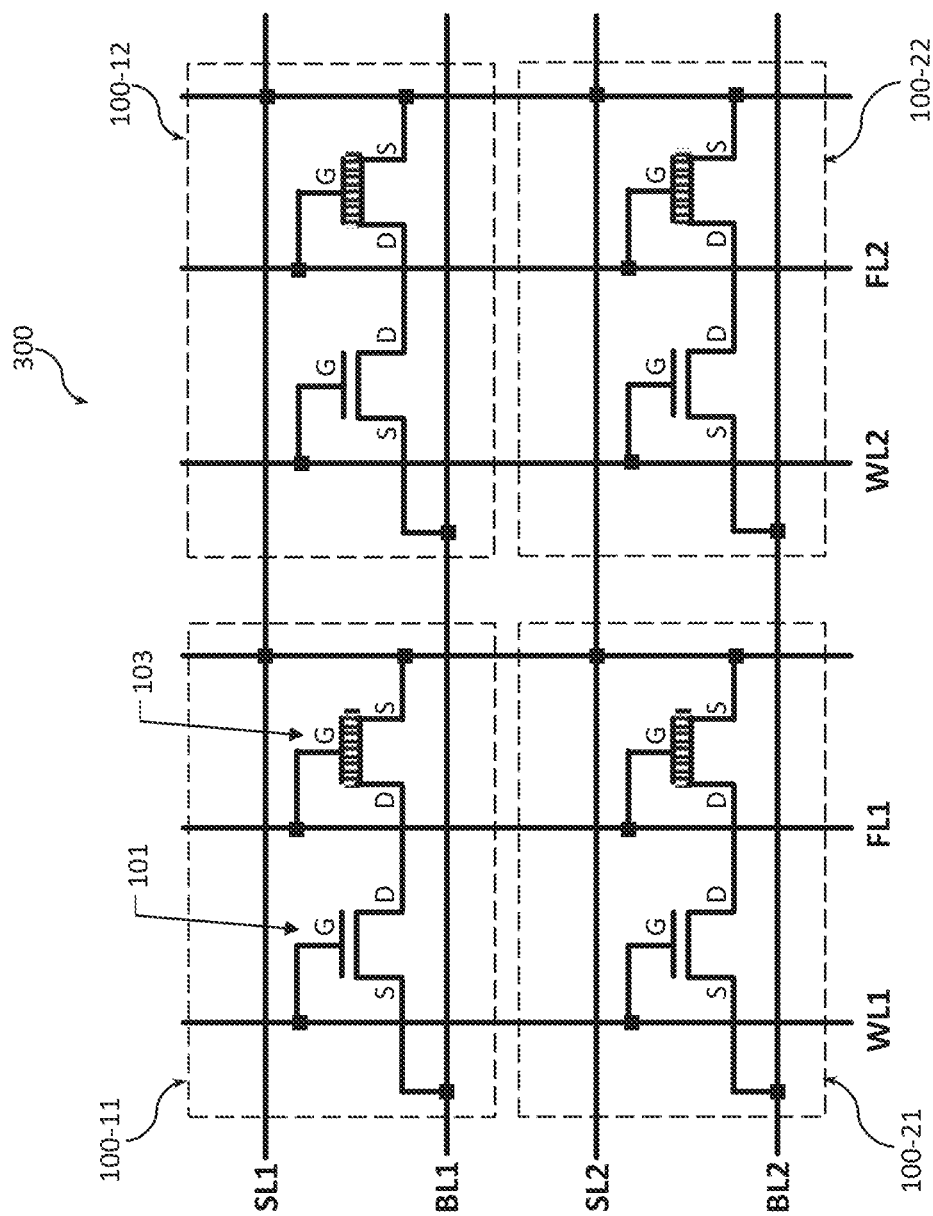
FIG. 8 provides a schematic illustration of a plurality of 1T-1FE-FET memory cells arranged in an array, according to some embodiments of the present disclosure.

FIG. 8 provides a schematic illustration of a plurality of 1T-1FE-FET memory cells, namely 4 cells, arranged in an array 300, according to some embodiments of the present disclosure. Each memory cell shown in FIG. 8 could be any one of the 1T-1FE-FET memory bit-cells as described herein. While only four such memory cells are shown in FIG. 8, in other embodiments, the array 300 may, and typically would, include many more memory cells. Furthermore, in other embodiments, the 1T-1FE-FET memory cells as described herein may be arranged in arrays in other manners as known in the art, all of which being within the scope of the present disclosure.

FIG. 8 illustrates that SL and BL can be shared among multiple memory cells 100 in a column (each 1T-1FE-FET memory cell 100 as described herein illustrated in FIG. 8 to be within a dashed box labeled 100-11, 100-12, 100-21, and 100-22), and that WL and FL can be shared among multiple memory cells 100 in a row. As is conventionally used in context of memory, the terms "row" and "column" do not reflect the, respectively, horizontal and vertical orientation on a page of a drawing illustrating a memory array but, instead, reflect on how individual memory cells are addressed. Namely, memory cells 100 sharing a single BL are said to be in the same column, while memory cells sharing a single WL are said to be on the same row. Thus, in FIG. 8, the horizontal lines refer to columns while vertical lines refer to rows. Different instances of each line (BL, SL, WL, and FL) are indicated in FIG. 8 with different reference numerals, e.g. BL1 and BL2 are the two different instances of the BL as described herein. The same reference numeral on the different lines SL and BL indicates that those lines are used to address/control the memory cells in a single column, e.g. SL1 and BL1 are used to address/control the memory cells 100 in column 1, and so on. The same reference numeral on the different lines WL and FL indicates that those lines are used to address/control the memory cells in a single row, e.g. WL2 and FL2 are used to address/control the memory cells 100 in row 2, and so on. Each memory cell 100 may then be addressed by using the SL and BL corresponding to the column of the cell and by using the WL and FL corresponding to the row of the cell. For example, the memory cell 100-11 is controlled by SL1, BL1, WL1, and FL1, the memory cell 100-12 is controlled by SL1, BL1, WL2, and FL2, and so on.

Next, methods of operating the 1T-1FE-FET memory cell as described herein will be explained, with reference to associated FIGS. In particular, FIGS. 9 and 10 illustrate a READ operation, while FIGS. 11-17 illustrate a WRITE operation.

FIG. 9 is a flow diagram of an example method 1000 for reading a 1T-1FE-FET memory cell, in accordance with various embodiments.

Although the operations of the method 1000 are illustrated once each and in a particular order, the operations may be performed in any suitable order and repeated as desired. For example, one or more operations may be performed in parallel or/and the operations may be performed in a different order. Furthermore, even though the operations of the method 1000 are described with reference to the memory cell 100 illustrated in FIG. 1 or in FIG. 8, performing this method on any other 1T-1FE-FET memory cells as described herein is within the scope of the present disclosure. The same considerations are applicable to methods illustrated in FIGS. 11 and 15-17.

At 1002 shown in FIG. 9, the WL is asserted (e.g., the WL transitions from logic low to logic high to turn on the access transistor 101), e.g. by applying voltage sufficient to turn on the transistor 101, e.g. 1.0 Volts (V) as illustrated in FIG. 10. Once the access transistor 101 is switched on, current can flow through it, between the first terminal and the second terminal of the transistor terminal pair as defined herein. Because the ferroelectric transistor 103 is connected in series with the access transistor 101, if current flows through the access transistor 101, then current also flows through the ferroelectric transistor 103, as is schematically illustrated in FIG. 10 with a READ current 150. Furthermore, the current flowing through this series of transistors 101 and 103 is modulated (i.e. affected/changed) by the polarization state of the ferroelectric material 124 in the ferroelectric transistor 103. As described above, the first terminal of the transistor terminal pair of the access transistor 101 is coupled to the BL. Therefore, the current through this series of transistors 101 and 103 flows to the BL. At 1004 shown in FIG. 9, a sense amplifier may be configured to sense the current (or voltage) in the BL and convert the magnitude of the sensed current or voltage to a digital logic value. Because the current or voltage in the BL depends on the polarization state of the ferroelectric transistor 103, sensing this current or voltage allows deducing the polarization state of the ferroelectric transistor 103. This is schematically illustrated in FIG. 10 with the BL having a voltage of, e.g. 0.2V, which is sensed by a sense amplifier to deduce the logic state of the ferroelectric transistor 103.

Thus, similar to e.g. a 3T eDRAM bit-cell, the 1T-1FE-FET SRAM bit-cell 100 is read by sensing the current through an access transistor. In some embodiments, unlike an eDRAM bit-cell, logic state is stored in the 1T-1FE-FET bit-cell 100 as a polarization of a ferroelectric gate stack, allowing for longer retention times (compared to eDRAM) which are insensitive to subthreshold leakage.

Referring, again, to the exemplary memory array 300 shown in FIG. 8, during a READ operation, for unselected words in the array, the WL remains de-asserted (e.g., the WL remains or is transitioned from logic high to logic low, e.g. 0V) and the access transistors having gate terminals coupled to such WL remain turned off. This will enable clear sensing of the selected memory cell by reducing the current through the unselected memory cells which may be connected to the same BL. For example, during the READ of the memory cell 100-11 shown in FIG. 8, WL1 is asserted so that the access transistor 101 of the memory cell 100-11 turns on and a sense amplifier senses current or voltage on the BL1 to determine the logic state of the memory cell 100-11. The memory cell 100-12 is connected to the same bit-line BL1 and, therefore, could, in principle, affect the current or voltage on BL1. However, because WL2 is de-asserted when WL1 is asserted to READ the memory cell 100-11, the access transistor of the memory cell 100-12 is off and there is no current flowing through the series of the access and ferroelectric transistor of the memory cell 100-12 and affecting the reading of the memory cell 100-11.

Figure 11:
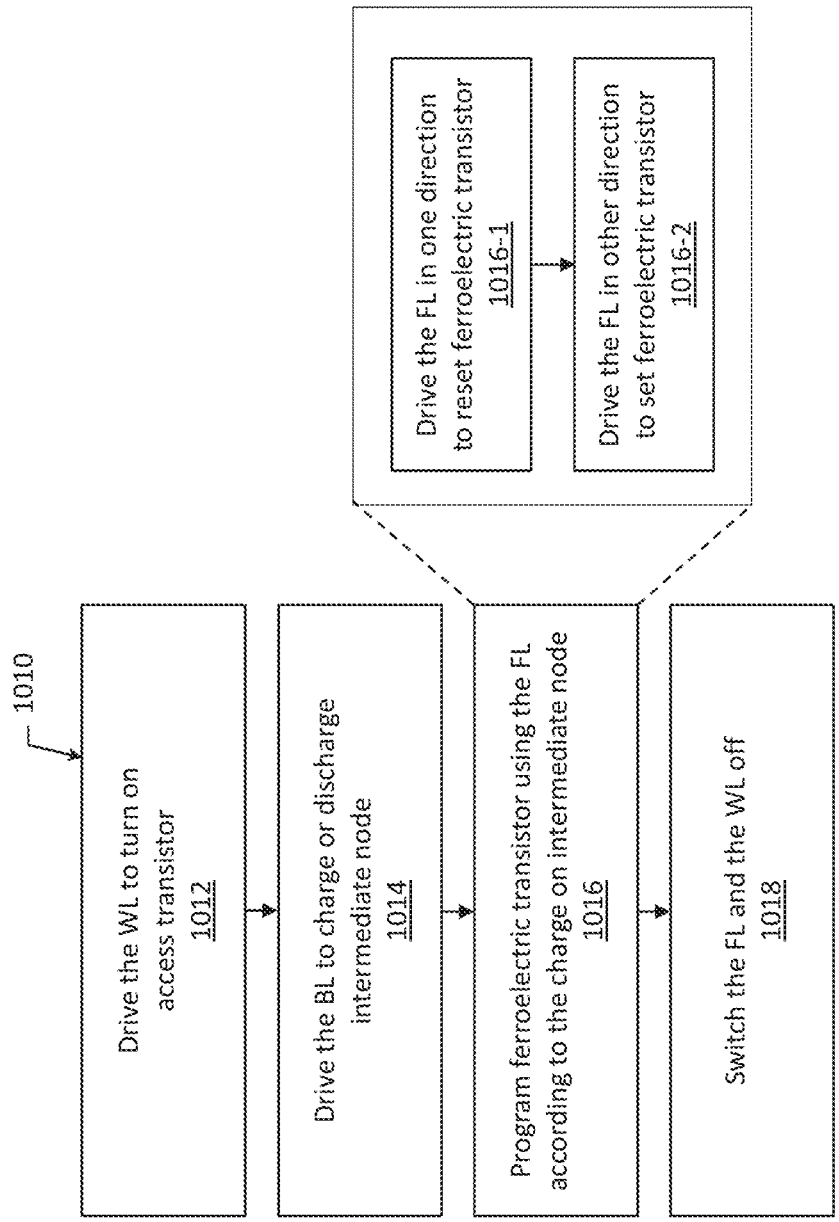
FIG. 11 is a flow diagram of an example method for programming a 1T-1FE-FET memory cell, in accordance with various embodiments.

FIG. 11 is a flow diagram of an example method 1010 for programming, i.e. writing to, a 1T-1FE-FET memory cell, in accordance with various embodiments.

At 1012 shown in FIG. 11, the WL is asserted to turn on the access transistor 101, similar to the operation 1002 shown in FIG. 9 and described above. Again, once the access transistor 101 is switched on, current can flow through it, between the first terminal and the second terminal of the transistor terminal pair as defined herein.

At 1014, the BL is asserted to charge or discharge the intermediate node 105, which may be helpful later in setting the desired polarization state of the ferroelectric material 124 in the memory cell 100.

For a WRITE operation, an electric field must be applied across the ferroelectric material 124 of the ferroelectric transistor 103 in order to polarize the ferroelectric material 124 in a direction corresponding to the desired logic state. Such an electric field may be applied by changing the voltage on the FL. Therefore, at 1016, the ferroelectric transistor 103 of the memory cell 100 is programmed using the FL according to the charge on the intermediate node 105. In particular, the programming operation 1016 may be a two-phase operation illustrated as an inset in FIG. 11.

As shown in FIG. 11 with operation 1016-1, in the first phase, the FL is driven in one direction (i.e. a first voltage of sufficiently high magnitude and a predefined polarity is applied on the FL), for more than a minimum transition duration (e.g., 100 nanoseconds (ns)), to reset, or clear, the ferroelectric transistor 103. In other words, in the first phase, electric field is established, sufficient to polarize the ferroelectric material 124 to a particular known state, e.g. the one corresponding to logic state "0."

The term "minimum transition duration" here generally refers to a suitable duration of time during which a voltage (e.g., due to the voltage on the FL, possibly in combination with SL and the charge on the intermediate node 105) is applied to a ferroelectric material to cause the ferroelectric material to be polarized and to store a charge according to the applied voltage. The minimum transition duration may be a predetermined value depending on the ferroelectric material stack and their thicknesses. Various embodiments here are described with the minimum transition duration as being 100 ns, however, this parameter should not be understood to be limiting as the minimum transition duration could be designed to be substantially shorter or longer based upon application-specific requirements. In general, longer minimum transition times can enable lower voltage operation, higher read signals, longer ferroelectric retention.

As such, depending on the electric field applied across the ferroelectric material 124, a logic state "1" or logic state "0" is stored as charge in the ferroelectric material when the voltage that establishes this electric field is applied for more or equal to the minimum transition duration. This charge can be substantially non-volatile (i.e., it decays over a very long period of time compared to the required storage/retention time). In some cases, non-volatility can be traded for lower voltage operation. For example, potentially the ferroelectric material could be designed to switch faster at a lower voltage but would also depolarize faster and provide shorter duration of non-volatility (e.g., 1 hour of non-volatile (NV) storage) before a refresh is needed.

In the second phase, following the first phase, shown in FIG. 11 with operation 1016-2, the FL may be driven in the other direction (i.e. a second voltage of the opposite polarity than that applied at 1016-1 is applied on the FL) to set the ferroelectric transistor 103 to the desired logic state by providing electric field, for the minimum transition duration, due to the combination of the voltage applied to the FL and the charge on the intermediate node 105, that is sufficient to switch the polarization of the ferroelectric material 124 from the state set at 1016-1 to the desired state, e.g. the one corresponding to logic state "1."

At 1018, the FL and the WL may be switched off, i.e. de-asserted.

Some of the operations of FIG. 11 are illustrated with some examples shown in FIGS. 12A through 14B.

FIG. 12A is a schematic illustration of a 1T-1FE-FET memory cell with an indication of exemplary voltages in a RESET phase, i.e. operation 1016-1 described herein, of a WRITE operation, according to some embodiments of the present disclosure. As shown in FIG. 12A, the WL is asserted, in operation 1012 described herein, by applying e.g. a voltage of 1.55V to the WL, to turn on the access transistor 101 and, in operation 1016-1 described herein, the FL is asserted, by applying a voltage sufficient to polarize the ferroelectric material 124 to a predefined logic state, e.g. logic state "0," by applying e.g. a voltage of 1.75 V to the FL.

FIG. 12B provides a schematic illustration of a RESET state as a result of the operation 1016-1. More specifically, FIG. 12B is a schematic illustration of a hysteresis loop for an exemplary 1T-1FE-FET memory cell with an indication of an exemplary RESET state, according to some embodiments of the present disclosure. As for a typical hysteresis loop, the x-axis indicates voltage applied to create an electric field across the ferroelectric material, e.g. measured in V, while the y-axis indicates the polarization of the ferroelectric material capacitor, e.g. surface charge density measured in microcoulomb per square centimeter ($uC/cm^2$). FIG. 12B illustrates exemplary remnant charge $Q_r$, saturation charge $Q_s$, and coercive voltage $V_c$, which are three important parameters that characterize any hysteresis loop of a ferroelectric material. FIG. 12B further illustrates voltages that need to be applied in order to polarize the ferroelectric material to a desired logic state, shown in FIG. 12B as voltage $V_{max}$ to polarize the ferroelectric material to set it to logic state "0" and voltage—$V_{max}$ to polarize the ferroelectric material to set it to logic state "1."

A circle 152 shown in FIG. 12B illustrates an operating point when a voltage equal to or greater than voltage $V_{max}$ is applied for at least the minimum transition duration, electric field is created across the ferroelectric material 124, which electric field is sufficient to polarize the ferroelectric material to what is referred in this exemplary hysteresis loop as the logic state "0." The charge accumulation on the ferroelectric material 124 is the saturation charge $Q_s$. For the example shown in FIG. 12B, $V_{max}$ is equal to 1.75V. Of course, in other embodiments, values for various voltages and charges could be different from those shown in the example of FIG. 12B. Those values would depend on the characteristics of a particular ferroelectric material used, or a stack of such materials and their thicknesses, as well as on circuit design considerations.

An arrow shown near the ferroelectric transistor 103 in FIG. 12A illustrates an exemplary direction of the polarization of the ferroelectric material 124 at the RESET.

It should be noted that FIG. 12A illustrates a particular embodiment where the voltage $V_{max}$ equal to 1.75V is applied on the FL, while the voltage on the BL is zero. Thus, it illustrates that a sufficient voltage may be applied to the FL to switch the ferroelectric material to a desired polarization even without switching the voltage of the BL. However, in other embodiments, suitable voltages may be applied on both the FL and the BL in order to produce, in total, the voltage $V_{max}$ to switch the ferroelectric material to the desired polarization. In still other embodiments, the FL may be held at a suitable constant voltage, and suitable voltage may be applied on the BL to switch the ferroelectric material to the desired polarization. For example, it may be advantageous to operate memory at lower supply voltages, e.g. in order to improve energy efficiency and reliability. If the FL is held at a constant voltage and the voltage of the BL switched, a voltage range of up to VDD may be applied across the ferroelectric material 124. Such an ability to switch both the FL and the BL when the 1T-1FE-FET configuration as described herein is used advantageously allows range of voltage range of up to 2*VDD to be applied across the ferroelectric material.

In some embodiments, the FL may be switched to enable a larger voltage range across the ferroelectric material 124.

Figure 13A:
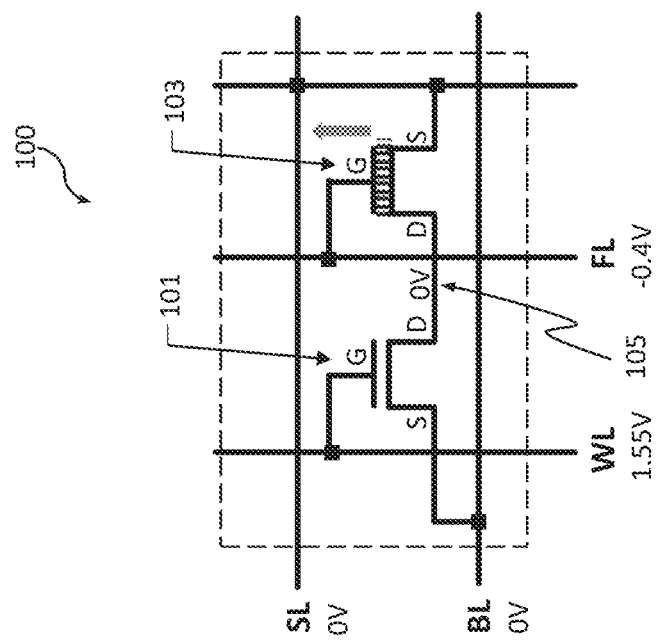
FIG. 13A is a schematic illustration of a 1T-1FE-FET memory cell with an indication of exemplary voltages in a NO-SET phase of a WRITE operation, according to some embodiments of the present disclosure.
Figure 13B:
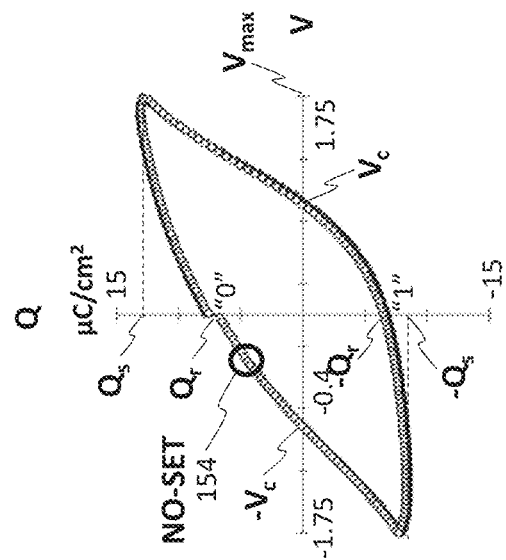
FIG. 13B is a schematic illustration of a hysteresis loop for a 1T-1FE-FET memory cell with an indication of an exemplary NO-SET state, according to some embodiments of the present disclosure.
Figure 14A:
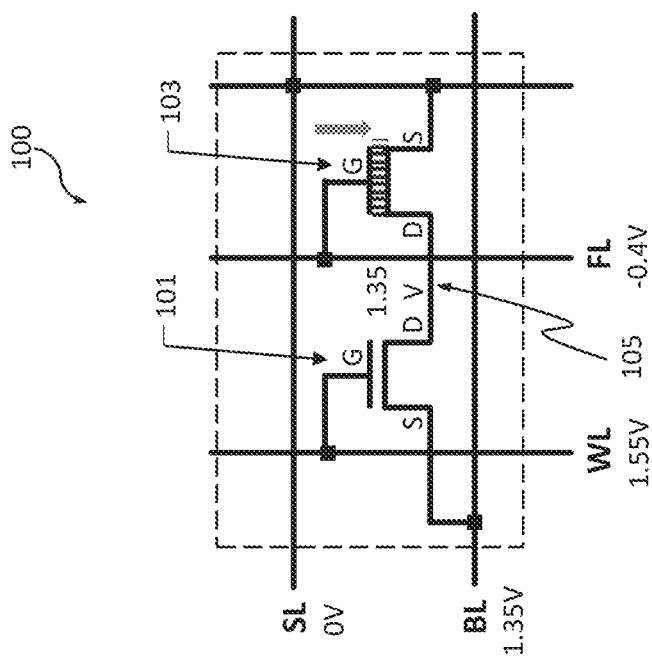
FIG. 14A is a schematic illustration of a 1T-1FE-FET memory cell with an indication of exemplary voltages in a SET phase of a WRITE operation, according to some embodiments of the present disclosure.
Figure 14B:
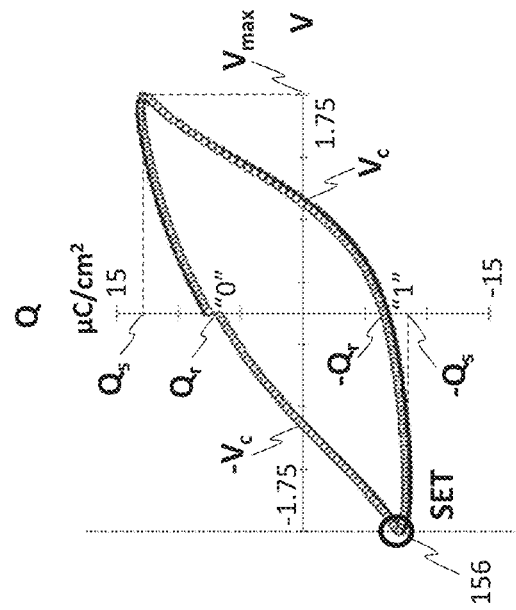
FIG. 14B is a schematic illustration of a hysteresis loop for a 1T-1FE-FET memory cell with an indication of an exemplary SET state, according to some embodiments of the present disclosure.

Together, FIGS. 13A-B and 14A-B provide a schematic illustration of a SET phase, i.e. operation 1016-2 described herein, of a WRITE operation, according to some embodiments of the present disclosure. The 1T-1FE-FET memory cell shown in FIGS. 13A and 14A is similar to that shown in FIG. 12A, but with different exemplary voltages applicable to their corresponding stage of operation. Similarly, the hysteresis loop shown in FIGS. 13B and 14B is similar to that shown in FIG. 12B, but with different operating point voltages applicable to their corresponding stage of operation.

FIG. 13B illustrates the second voltage which may be applied to the FL at operation 1016-2 described herein, e.g. voltage of −0.4V, this operating point indicated in FIG. 13B with a circle 154. As shown in corresponding FIG. 13A, at that time, the voltage on the BL, and the SL, may be zero. The WL may be asserted and the intermediate node may be discharged and held at zero volts. As shown with the hysteresis loop of FIG. 13B, the voltage applied to the FL, on its own, is not enough to switch the polarization of the ferroelectric material which was set to logic state "0" to logic state "1." However, remaining voltage that is needed to switch the polarization to logic state "1" may be provided on the intermediate node 105 by turning the access transistor on (asserting the WL) and applying appropriate voltage on the BL. In FIG. 14A, the WL is asserted to 1.55V so that the NMOS access transistor 101 may charge the intermediate node 105 to approximately 1.35V due to a 0.20 V threshold voltage drop across the transistor 101. Overdriving the access transistor 101 can enable a single type of transistor (e.g N-type) to be used for the access transistor. Using a single type of access transistor enables a compact bitcell and reduces cost. Because now, simultaneously, 1.35V is provided on the intermediate node 105 and −0.4V is applied on the FL, together the maximum voltage $-V_{max}$ is reached to switch the polarization state of the ferroelectric transistor 103 to the opposite logic state, i.e. logic state "1" for the example described herein. A circle 156 shown in FIG. 14B illustrates an operating point when a voltage magnitude equal to or greater than voltage $-V_{max}$ is applied, as shown in the example of FIG. 14A as a combination of voltage on the FL and voltage on the BL, for at least the minimum transition duration, electric field is created across the ferroelectric material 124, which electric field is sufficient to switch the polarization of the ferroelectric material to what is referred in this exemplary hysteresis loop as the logic state "1."

Embodiments where both the FL and the BL is manipulated in a WRITE operation as described above may be particularly advantageous for the 1T-1FE-FET cell arrays where the FL is disposed over a substrate in parallel with the WL and addresses an entire row of a memory array, such as e.g. the one shown in FIG. 8. Using a continuous FL is highly area-efficient because it enables getting rid of an additional access transistor to control driving of the FL (i.e. only a single access transistor 101 can be used, thus saving the valuable space on a die). Additionally, the 1T-1FE-FET cells proposed herein may be very compact as a single gate material may be patterned without area wasted in the cell for line-end spacing. However, because the FL runs in parallel with the WL, extra considerations must be taken to ensure that individual bits, i.e. individual memory cells, can be addressed. The two-phase WRITE operation as described herein may be used to enable writing of both logic states "1" and "0" into memory cells connected to the same FL and WL, but different BL. In the first phase described herein, i.e. operation 1016-1, a first voltage is applied to the FL and causes all memory cells connected to this FL to switch to a first polarization, e.g. logic state "0" as described above. In the second phase following the first phase, i.e. operation 1016-2, a second voltage may be applied to the FL. By itself, this second FL voltage will be insufficient to switch polarization so the voltage on the second terminal of the transistor terminal pair of the access transistor 101 (for the illustrations of FIGS. provided herein—the voltage on the drain terminal of the access transistor 101) must also be switched. To achieve this, the WL is asserted (e.g. 1.0V) and the access transistor 101 turns on. The BL is also asserted, so that the intermediate node 105 can be charged/discharged based on the voltage of the BL. With the charge on the intermediate node 105 reaches an appropriate voltage by the BL, the ferroelectric material in the ferroelectric transistor 103 may switch from the first polarization to a second polarization. In other words, the first phase of the two-phase WRITE clears memory cells coupled to a single FL to the same logic state, e.g. logic state "0" as described herein, and the second phase is used to selectively switch polarization of individual cells in the array, by charging the intermediate node 105 to the appropriate voltage by asserting WL and BL and by applying remaining voltage on the FL.

Referring, again, to the exemplary memory array 300 shown in FIG. 8, during a two-phase WRITE operation as described herein, first, voltage $V_{max}$ is applied on a particular FL and all ferroelectric transistors that have their gates coupled to this FL will polarize to the same state, e.g. logic state "0." Voltage on a particular BL may be varied, together with the WL corresponding to the FL to which voltage $V_{max}$ was applied being asserted to turn on the access transistors having gate terminals coupled to such WL, so that the intermediate node of the access transistor that is connected to the BL and the WL being asserted is charged to make sure that the ferroelectric transistor associated with that access transistor flips its polarization to a different logic state, e.g. state "1.". For example, during the WRITE of the memory cell 100-11 shown in FIG. 8, FL1 is asserted to ensure that all of the memory cells in the first row (i.e. cells 100-11 and 100-21) are set to a first polarization state, e.g. logic state "0," WL1 is asserted so that the access transistor 101 of the memory cell 100-11 turns on while BL1 applies suitable voltage to charge the intermediate node 105 of the memory cell 100-11 to a value that will allow switching the polarization of the memory cell 100-11 to the opposite logic state, e.g. state "1." On the other hand, holding BL2 at 0V will discharge the intermediate node 105 of the memory cell 100-21, while intermediate nodes 105 of each of the memory cells 100-12 and 100-22 will not be affected because WL2 is off (i.e. not asserted). Subsequently reducing voltage of FL1 will cause the memory cell 100-11 to SET because of the accumulated high voltage of the intermediate node 105 in this memory cell. On the other hand, the memory cell 100-21 will not SET because of the low voltage (discharged state) of the intermediate node 105 in the cell 100-21.

Figures 15, 16, 17:
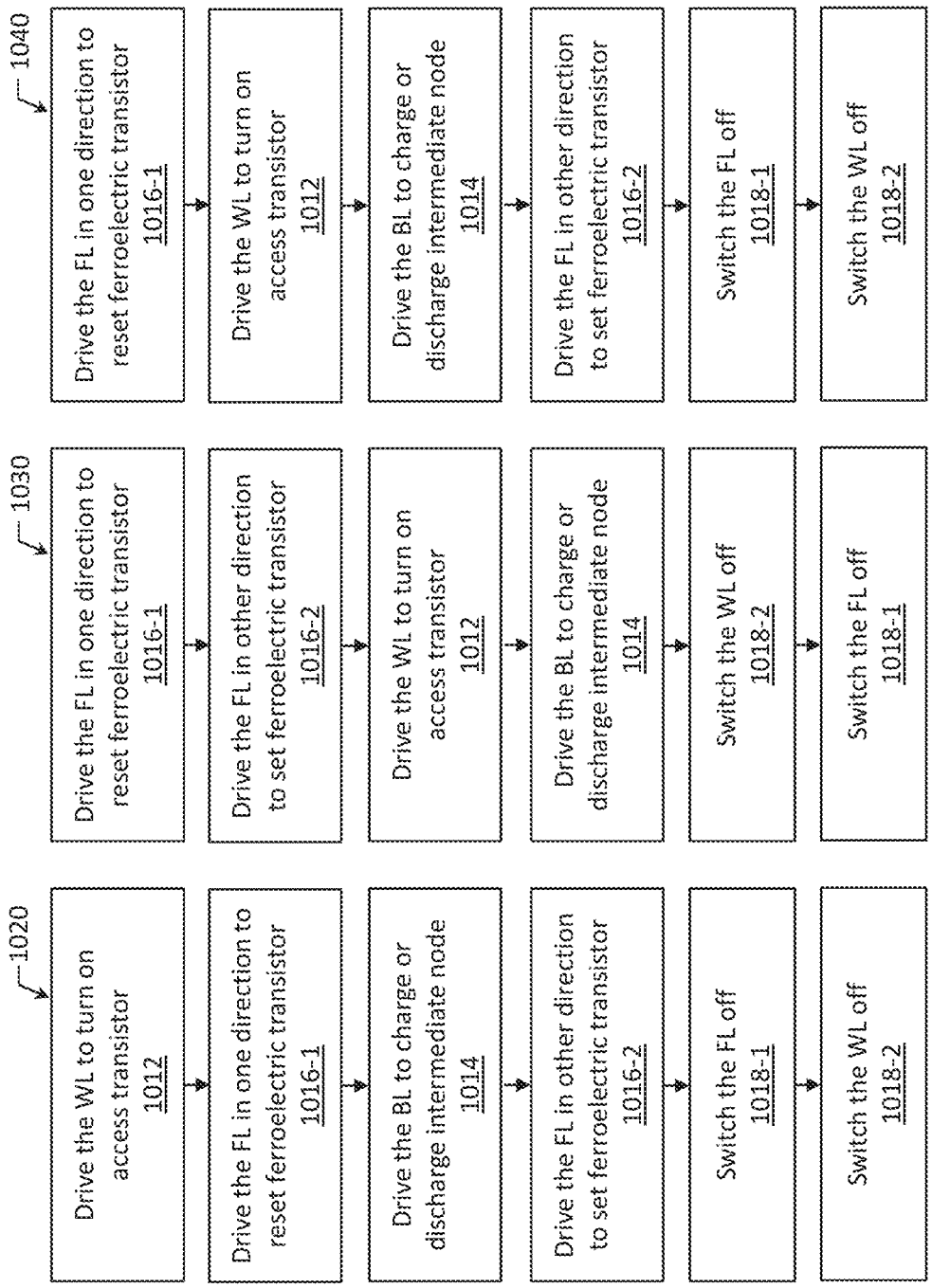
FIGS. 15-17 are flow diagrams of example methods for programming a 1T-1FE-FET memory cell, in accordance with various embodiments.

FIGS. 15-17 are flow diagrams of example methods 1020, 1030, and 1040 for programming a 1T-1FE-FET memory cell, in accordance with various embodiments. These methods include the same operations as those illustrated in the method 1010 shown in FIG. 11, as indicated by the same reference numerals of the operations as used in FIG. 11 except that the operation 1018 of FIG. 11 is divided in FIGS. 15-17 into two separate operations, 11018-1 and 1018-2, which is intended to illustrate how the two-phase WRITE access described herein can be performed when individual operations are performed in different order. In particular, FIG. 15 illustrates that operations of the method 1010 may be performed in the following order: 1012, 1016-1, 1014, 1016-2, 1018-1, and 1018-2. On the other hand, FIG. 16 illustrates that operations of the method 1010 may be performed in the following order: 1016-1, 1016-2, 1012, 1014, 1018-2, and 1018-1. FIG. 17 illustrates that operations of the method 1010 may be performed in the following order: 1016-1, 1012, 1014, 1016-2, 1018-1, and 1018-2. Other modifications of the order of these steps in accordance with the principles described herein can be envisioned and are within the scope of the present disclosure.

Figure 18A:
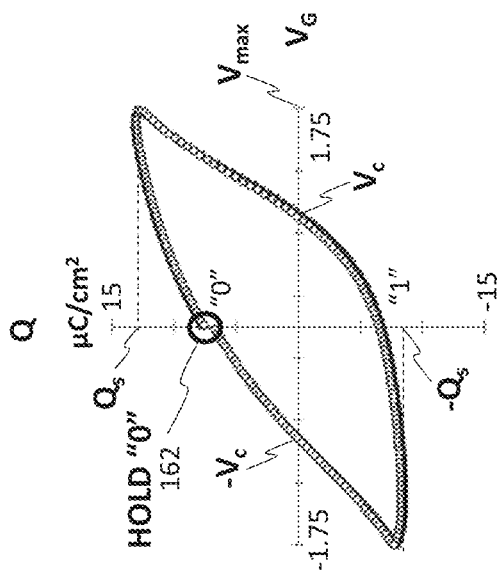
FIG. 18A is a schematic illustration of a hysteresis loop illustrating an example of holding a logic state "0" in a 1T-1FE-FET memory cell, according to some embodiments of the present disclosure.
Figure 18B:
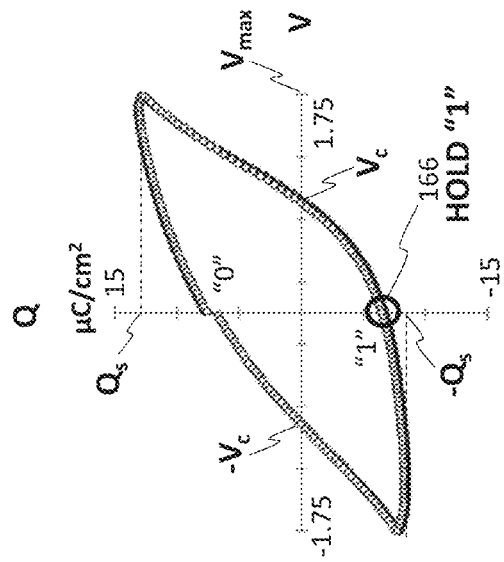
FIG. 18B is a schematic illustration of a hysteresis loop illustrating an example of holding a logic state "1" in a 1T-1FE-FET memory cell, according to some embodiments of the present disclosure.

FIGS. 18A and 18B an exemplary hysteresis loop as described above (same loop as shown in FIGS. 12B-14B), provide schematic illustrations of the 1T-1FE-FET memory cell as described herein holding, respectively, a logic state "0" and a logic state "1." in a 1T-1FE-FET memory cell, according to some embodiments of the present disclosure. As shown in FIGS. 18A and 18B, in order to hold the logic state written to the 1T-1FE-FET cell, nearly zero volts is required across the ferroelectric material 124 to prevent unintended depolarization. This illustrates that the access transistor 101 as described herein provides efficient isolation of the ferroelectric transistor 103 from the BL, i.e. even if non-zero voltage is applied on the BL, the ferroelectric transistor 103 that is supposed to hold its state is able to do so because of the access transistor 101 associated with it.

Figure 19:
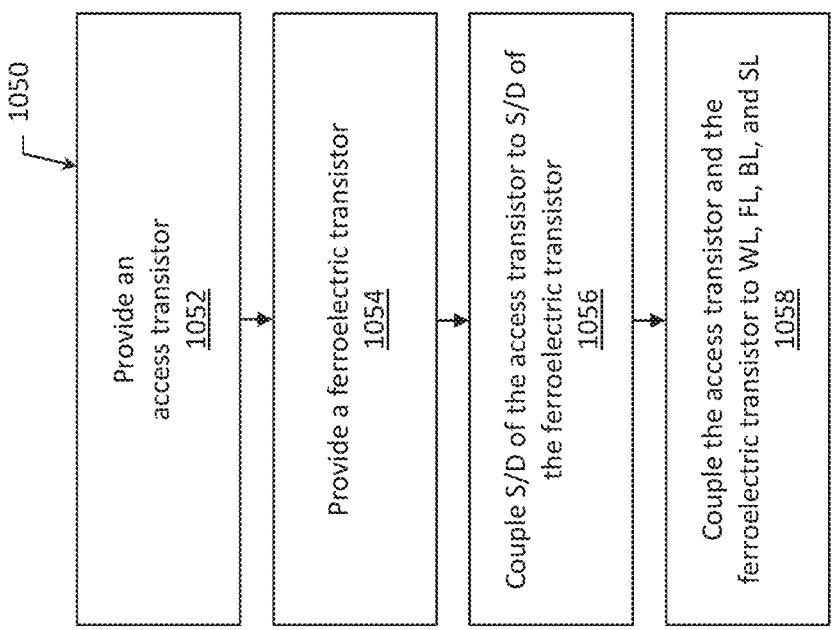
FIG. 19 is a flow diagram of an example method of manufacturing a 1T-1FE-FET memory cell, in accordance with various embodiments.

The 1T-1FE-FET memory cells 100 disclosed herein may be manufactured using any suitable techniques. For example, FIG. 19 is a flow diagram of an example method 1050 of manufacturing a 1T-1FE-FET memory cell, in accordance with various embodiments. Although the operations of the method 1050 are illustrated once each and in a particular order, the operations may be performed in any suitable order and repeated as desired. For example, one or more operations may be performed in parallel e.g. to manufacture multiple 1T-1FE-FET memory cells substantially simultaneously, or/and to manufacture the access transistors and the ferroelectric transistors of the 1T-1FE-FET memory cells substantially simultaneously. In another example, the operations may be performed in a different order to reflect the structure of a memory device in which the 1T-1FE-FET memory cell will be included.

At 1052, an access transistor may be provided over a substrate. The access transistor may include a channel, and gate, source, and drain terminals which may take the form of any of the embodiments of the access transistor 101 disclosed herein (e.g. any of the embodiments discussed herein with reference to a tri-gate access transistor or an all-around-gate access transistor). The channel material, gate electrode material, and source and drain regions of the access transistor may be provided at 1052 using any suitable deposition and patterning techniques known in the art, such as e.g. atomic layer deposition (ALD), chemical vapor deposition (CVD), physical vapor deposition (PVD) and various lithographic techniques such as e.g. photolithography or electron-beam lithography.

At 1054, a ferroelectric transistor may be provided over a substrate. The ferroelectric transistor may include a channel, and gate, source, and drain terminals which may take the form of any of the embodiments of the ferroelectric transistor 103 disclosed herein (e.g. any of the embodiments discussed herein with reference to a tri-gate ferroelectric transistor or an all-around-gate ferroelectric transistor). The channel material, gate electrode material, and source and drain regions of the ferroelectric transistor may be provided at 1054 using any suitable deposition and patterning technique known in the art. The ferroelectric transistor would include a ferroelectric material, or a stack of such materials, integrated with its gate, e.g. as described herein with reference to the ferroelectric material 124. The ferroelectric material may be provided at 1054 using any suitable techniques known in the art. If the access transistor provided at 1052 is a ferroelectric transistor as well, then 1052 would also include providing the ferroelectric material using any suitable techniques known in the art.

At 1056, the access transistor may be coupled to the ferroelectric transistor. Such coupling may take the form of any of the embodiments of the access transistor 101 coupled to the ferroelectric transistor 103 disclosed herein (e.g. any of the embodiments discussed herein with reference to a source/drain terminal of the access transistor 101 being coupled to the source/drain terminal of the ferroelectric transistor 103). The coupling may be provided at 1056 using any suitable techniques known in the art.

At 1058, the access transistor and the ferroelectric transistor are coupled to READ and/or WRITE control lines. Such coupling may take the form of any of the embodiments of the access transistor 101 and the ferroelectric transistor 103 coupled to the WL, FL, BL, and SL disclosed herein (e.g. any of the embodiments discussed herein with reference to the gate terminal of the access transistor 101 is coupled to the WL, the gate terminal of the ferroelectric transistor 103 is coupled to the FL, the S/D terminal of the access transistor 101 that is not coupled to the ferroelectric transistor 103 coupled to the BL, and the S/D terminal of the ferroelectric transistor 103 that is not coupled to the access transistor 101 coupled to the SL. The coupling may be provided at 1058 using any suitable techniques known in the art.

The method 1050 may further include other manufacturing operations related to fabrication of other components of the 1T-1FE-FET cell 100.

The 1T-1FE-FET memory cells disclosed herein may be included in any suitable electronic device. FIGS. 20-23 illustrate various examples of apparatuses that may include one or more of the 1T-1FE-FET memory cells disclosed herein.

Figure 20B:
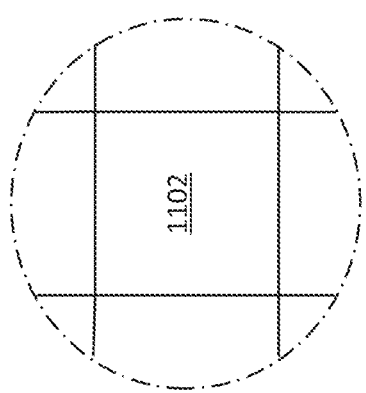
FIGS. 20A and 20B are top views of a wafer and dies that include one or more 1T-1FE-FET memory cells in accordance with any of the embodiments disclosed herein.
Figure 20A:
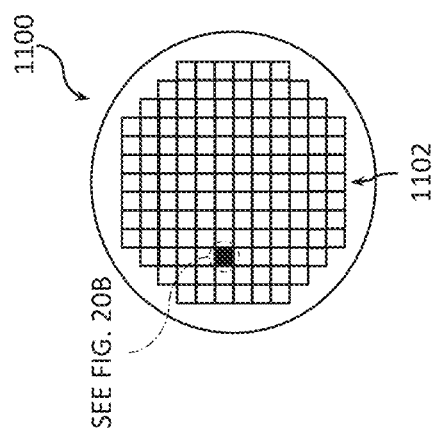

FIGS. 20A-B are top views of a wafer 1100 and dies 1102 that may include one or more 1T-1FE-FET memory cells in accordance with any of the embodiments disclosed herein. The wafer 1100 may be composed of semiconductor material and may include one or more dies 1102 having IC structures formed on a surface of the wafer 1100. Each of the dies 1102 may be a repeating unit of a semiconductor product that includes any suitable IC (e.g., ICs including access transistors 101 and ferroelectric transistors 103 that form one or more 1T-1FE-FET memory cells 100). After the fabrication of the semiconductor product is complete (e.g., after manufacture of an array of 1T-1FE-FET memory cells 100, such as e.g. the array 300), the wafer 1100 may undergo a singulation process in which each of the dies 1102 is separated from one another to provide discrete "chips" of the semiconductor product. In particular, devices that include one or more 1T-1FE-FET memory cells as disclosed herein may take the form of the wafer 1100 (e.g., not singulated) or the form of the die 1102 (e.g., singulated). The die 1102 may include one or more memory devices (e.g., one or more of the memory 1404 of FIG. 23, discussed below, which may take the form of any 1T-1FE-FET memory cell 100 or an array of such memory cells) and/or supporting circuitry to route electrical signals to the memory cells, transistors, as well as any other IC components. In some embodiments, the wafer 1100 or the die 1102 may include other transistor devices, a logic device (e.g., an AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 1402 of FIG. 23) or other logic that is configured to store information in the memory devices or execute instructions stored in the memory array.

Figure 21:
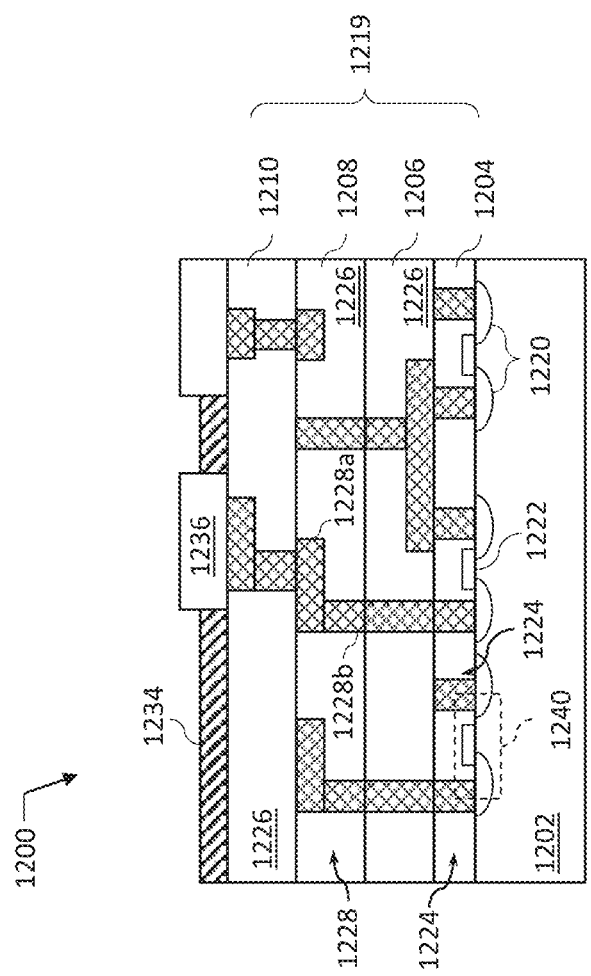
FIG. 21 is a cross-sectional side view of an integrated circuit (IC) device that may include one or more 1T-1FE-FET memory cells in accordance with any of the embodiments disclosed herein.

FIG. 21 is a cross-sectional side view of an IC device 1200 that may include one or more 1T-1FE-FET memory cells in accordance with any of the embodiments disclosed herein. The IC device 1200 may be formed on a substrate 1202 (e.g., the wafer 1100 of FIG. 20A) and may be included in a die (e.g., the die 1102 of FIG. 20B). The substrate 1202 may be a semiconductor substrate composed of semiconductor material systems including, for example, N-type or P-type materials systems. The substrate 1202 may include, for example, a crystalline substrate formed using a bulk silicon or a silicon-on-insulator substructure. In some embodiments, the semiconductor substrate 1202 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the substrate 1202. Although a few examples of materials from which the substrate 1202 may be formed are described here, any material that may serve as a foundation for an IC device 1200 may be used. The substrate 1202 may be part of a singulated die (e.g., the dies 1102 of FIG. 20B) or a wafer (e.g., the wafer 1100 of FIG. 20A).

The IC device 1200 may include one or more device layers 1204 disposed on the substrate 1202. The device layer 1204 may include features of one or more transistors 1240 (e.g., metal oxide semiconductor field-effect transistors (MOSFETs)) formed on the substrate 1202. The device layer 1204 may include, for example, one or more source and/or drain (S/D) regions 1220, a gate 1222 to control current flow in the transistors 1240 between the S/D regions 1220, and one or more S/D contacts 1224 to route electrical signals to/from the S/D regions 1220. The transistors 1240 may include additional features not depicted for the sake of clarity, such as device isolation regions, gate contacts, and the like. The transistors 1240 are not limited to the type and configuration depicted in FIG. 21 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors. In particular, two or more of the transistors 1240 may form one or more 1T-1FE-FET memory cells 100 in accordance with any of the embodiments disclosed herein. For example, one transistor 1240 may take the form of any of the access transistors 101 disclosed herein (e.g., any of the tri-gate access transistors 101 discussed herein with reference to FIGS. 2-4, and any of the all-around-gate access transistors 101 discussed herein with reference to FIGS. 5-7), while another transistor 1240 may take the form of any of the ferroelectric transistors 103 disclosed herein (e.g., any of the ferroelectric transistors 103 discussed herein with reference to FIGS. 2-4, and any of the all-around-gate ferroelectric transistors 103 discussed herein with reference to FIGS. 5-7). The S/D regions 1220 may include the regions 120 or 220, and 122/222 described herein. Thin-film transistors 1240 implementing the 1T-1FE-FET memory cells 100 may be particularly advantageous when used in a microprocessor device, logic circuitry, or memory circuitry, and may be formed along with existing complementary metal oxide semiconductor (CMOS) processes.

Each transistor 1240 may include a gate 1222 formed of at least two layers, a gate dielectric layer and a gate electrode layer. The gate electrode layer may take the form of any of the embodiments of the gate electrode material 108/208 disclosed herein. The gate dielectric layer may take the form of any of the embodiments of the gate dielectric material 110/210 disclosed herein. Generally, the gate dielectric layer of a transistor 1240 may include one layer or a stack of layers, and the one or more layers may include silicon oxide, silicon dioxide, and/or a high-k dielectric material. The high-k dielectric material included in the gate dielectric layer of the transistor 1240 may take the form of any of the embodiments of the high-k dielectric 110/210 disclosed herein, for example. In embodiments in which a transistor 1240 is a ferroelectric transistor 103 of a 1T-1FE-FET memory cell 100 described herein, a ferroelectric layer, which may take the form of any of the embodiments of the ferroelectric material 124 disclosed herein, may be provided between the gate electrode layer and the gate dielectric layer. Generally, the ferroelectric layer of a transistor 1240 may include one layer of ferroelectric material 124 or a stack of layers of ferroelectric materials.

In some embodiments, when viewed as a cross section of the transistor 1240 along the source-channel-drain direction, the gate electrode may consist of a U-shaped structure that includes a bottom portion substantially parallel to the surface of the substrate and two sidewall portions that are substantially perpendicular to the top surface of the substrate (e.g., as is the case for the tri-gate transistors 101 and 103 of FIGS. 2-4). In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers. In some embodiments, the gate electrode may consist of a V-shaped structure (e.g., when the fin 112 discussed with reference to FIGS. 2-4 does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1220 may be formed within the substrate 1202 adjacent to the gate 1222 of each transistor 1240. The S/D regions 1220 may take the form of any of the embodiments of the regions 120/122 and 220/222 discussed above with reference to the transistors included in 1T-1FE-FET memory cells 100. In other embodiments, the S/D regions 1220 may be formed using any suitable processes known in the art. For example, the S/D regions 1220 may be formed using either an implantation/diffusion process or a deposition process. In the former process, dopants such as boron, aluminum, antimony, phosphorous, or arsenic may be ion-implanted into the substrate 1202 to form the S/D regions 1220. An annealing process that activates the dopants and causes them to diffuse farther into the substrate 1202 may follow the ion implantation process. In the latter process, an epitaxial deposition process may provide material that is used to fabricate the S/D regions 1220. In some implementations, the S/D regions 1220 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1220 may be formed using one or more alternate semiconductor materials such as germanium or a group III-V material or alloy. In further embodiments, one or more layers of metal and/or metal alloys may be used to form the S/D regions 1220 (e.g., as discussed above with reference to the regions 120/122 and 220/222 discussed above with reference to the transistors included in 1T-1FE-FET memory cells 100). In some embodiments, an etch process may be performed before the epitaxial deposition to create recesses in the substrate 1202 in which the material for the S/D regions 1220 is deposited.

Electrical signals, such as power and/or input/output (I/O) signals, may be routed to and/or from the transistors 1240 of the device layer 1204 through one or more interconnect layers disposed on the device layer 1204 (illustrated in FIG. 21 as interconnect layers 1206-1210). For example, electrically conductive features of the device layer 1204 (e.g., the gate 1222 and the S/D contacts 1224) may be electrically coupled with the interconnect structures 1228 of the interconnect layers 1206-1410. The one or more interconnect layers 1206-1210 may form an interlayer dielectric (ILD) stack 1219 of the IC device 1200.

The interconnect structures 1228 may be arranged within the interconnect layers 1206-1210 to route electrical signals according to a wide variety of designs (in particular, the arrangement is not limited to the particular configuration of interconnect structures 1228 depicted in FIG. 21). Although a particular number of interconnect layers 1206-1210 is depicted in FIG. 21, embodiments of the present disclosure include IC devices having more or fewer interconnect layers than depicted.

In some embodiments, the interconnect structures 1228 may include trench structures 1228*a* (sometimes referred to as "lines") and/or via structures 1228*b* (sometimes referred to as "holes") filled with an electrically conductive material such as a metal. The trench structures 1228*a* may be arranged to route electrical signals in a direction of a plane that is substantially parallel with a surface of the substrate 1202 upon which the device layer 1204 is formed. For example, the trench structures 1228*a* may route electrical signals in a direction in and out of the page from the perspective of FIG. 21. The via structures 1228*b* may be arranged to route electrical signals in a direction of a plane that is substantially perpendicular to the surface of the substrate 1202 upon which the device layer 1204 is formed. In some embodiments, the via structures 1228*b* may electrically couple trench structures 1228*a* of different interconnect layers 1206-1210 together.

At least some of the one or more interconnect layers 1206-1210, or/and parts of such layers, e.g. the interconnect structures 1228, may form the WL, FL, BL, and SL lines described herein for coupling to the 1T-1FE-FET memory cells 100.

The interconnect layers 1206-1210 may include a dielectric material 1226 disposed between the interconnect structures 1228, as shown in FIG. 21. In some embodiments, the dielectric material 1226 disposed between the interconnect structures 1228 in different ones of the interconnect layers 1206-1210 may have different compositions; in other embodiments, the composition of the dielectric material 1226 between different interconnect layers 1206-1210 may be the same.

A first interconnect layer 1206 (referred to as Metal 1 or "M1") may be formed directly on the device layer 1204. In some embodiments, the first interconnect layer 1206 may include trench structures 1228*a* and/or via structures 1228*b*, as shown. The trench structures 1228*a* of the first interconnect layer 1206 may be coupled with contacts (e.g., the S/D contacts 1224) of the device layer 1204.

A second interconnect layer 1208 (referred to as Metal 2 or "M2") may be formed directly on the first interconnect layer 1206. In some embodiments, the second interconnect layer 1208 may include via structures 1228*b* to couple the trench structures 1228*a* of the second interconnect layer 1208 with the trench structures 1228*a* of the first interconnect layer 1206. Although the trench structures 1228*a* and the via structures 1228*b* are structurally delineated with a line within each interconnect layer (e.g., within the second interconnect layer 1208) for the sake of clarity, the trench structures 1228*a* and the via structures 1228*b* may be structurally and/or materially contiguous (e.g., simultaneously filled during a dual-damascene process) in some embodiments.

A third interconnect layer 1210 (referred to as Metal 3 or "M3") (and additional interconnect layers, as desired) may be formed in succession on the second interconnect layer 1208 according to similar techniques and configurations described in connection with the second interconnect layer 1208 or the first interconnect layer 1206.

The IC device 1200 may include a solder resist material 1234 (e.g., polyimide or similar material) and one or more bond pads 1236 formed on the interconnect layers 1206-1410. The bond pads 1236 may be electrically coupled with the interconnect structures 1228 and configured to route the electrical signals of the transistor(s) 1240 to other external devices. For example, solder bonds may be formed on the one or more bond pads 1236 to mechanically and/or electrically couple a chip including the IC device 1200 with another component (e.g., a circuit board). The IC device 1200 may have other alternative configurations to route the electrical signals from the interconnect layers 1206-1210 than depicted in other embodiments. For example, the bond pads 1236 may be replaced by or may further include other analogous features (e.g., posts) that route the electrical signals to external components.

Figure 22:
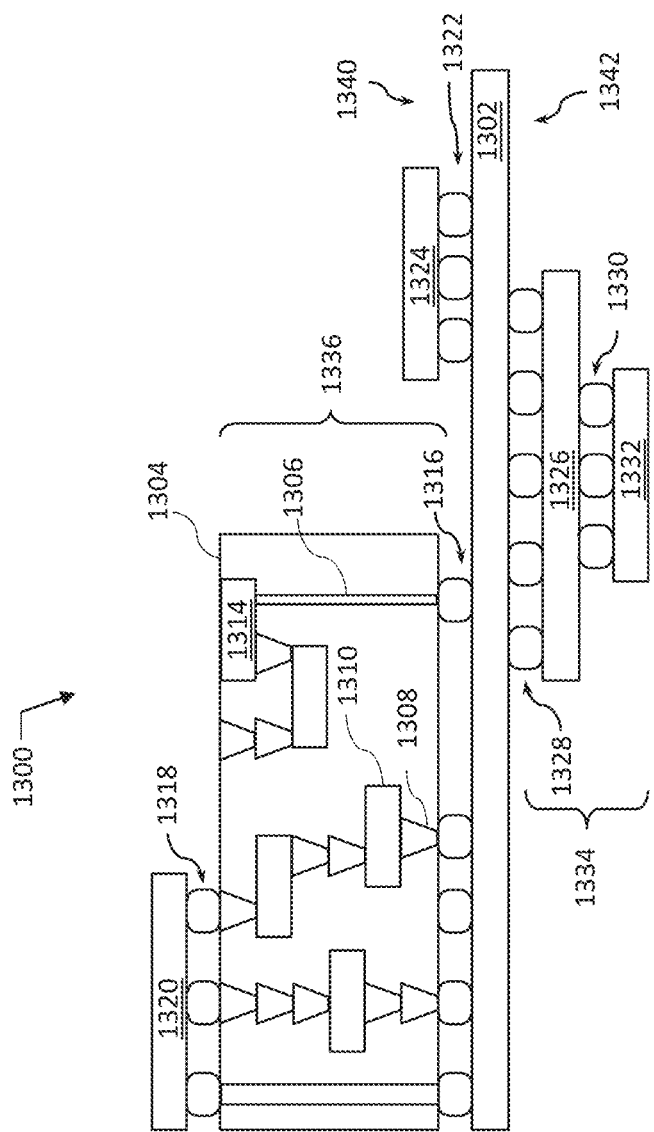
FIG. 22 is a cross-sectional side view of an IC device assembly that may include one or more 1T-1FE-FET memory cells in accordance with any of the embodiments disclosed herein.

FIG. 22 is a cross-sectional side view of an IC device assembly 1300 that may include components having one or more 1T-1FE-FET memory cells in accordance with any of the embodiments disclosed herein. The IC device assembly 1300 includes a number of components disposed on a circuit board 1302 (which may be, e.g., a motherboard). The IC device assembly 1300 includes components disposed on a first face 1340 of the circuit board 1302 and an opposing second face 1342 of the circuit board 1302; generally, components may be disposed on one or both faces 1340 and 1342. In particular, any suitable ones of the components of the IC device assembly 1300 may include any of the 1T-1FE-FET memory cells disclosed herein (e.g., in any of the 1T-1FE-FET memory cells 100 disclosed herein).

In some embodiments, the circuit board 1302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate.

The IC device assembly 1300 illustrated in FIG. 22 includes a package-on-interposer structure 1336 coupled to the first face 1340 of the circuit board 1302 by coupling components 1316. The coupling components 1316 may electrically and mechanically couple the package-on-interposer structure 1336 to the circuit board 1302, and may include solder balls (as shown in FIG. 22), male and female portions of a socket, an adhesive, an underfill material, and/or any other suitable electrical and/or mechanical coupling structure.

The package-on-interposer structure 1336 may include an IC package 1320 coupled to an interposer 1304 by coupling components 1318. The coupling components 1318 may take any suitable form for the application, such as the forms discussed above with reference to the coupling components 1316. Although a single IC package 1320 is shown in FIG. 22, multiple IC packages may be coupled to the interposer 1304; indeed, additional interposers may be coupled to the interposer 1304. The interposer 1304 may provide an intervening substrate used to bridge the circuit board 1302 and the IC package 1320. The IC package 1320 may be or include, for example, a die (the die 1102 of FIG. 20B), an IC device (e.g., the IC device 1200 of FIG. 21), or any other suitable component. Generally, the interposer 1304 may spread a connection to a wider pitch or reroute a connection to a different connection. For example, the interposer 1304 may couple the IC package 1320 (e.g., a die) to a ball grid array (BGA) of the coupling components 1316 for coupling to the circuit board 1302. In the embodiment illustrated in FIG. 22, the IC package 1320 and the circuit board 1302 are attached to opposing sides of the interposer 1304; in other embodiments, the IC package 1320 and the circuit board 1302 may be attached to a same side of the interposer 1304. In some embodiments, three or more components may be interconnected by way of the interposer 1304.

The interposer 1304 may be formed of an epoxy resin, a fiberglass-reinforced epoxy resin, a ceramic material, or a polymer material such as polyimide. In some implementations, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to through-silicon vias (TSVs) 1306. The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 1304. The package-on-interposer structure 1336 may take the form of any of the package-on-interposer structures known in the art.

The IC device assembly 1300 may include an IC package 1324 coupled to the first face 1340 of the circuit board 1302 by coupling components 1322. The coupling components 1322 may take the form of any of the embodiments discussed above with reference to the coupling components 1316, and the IC package 1324 may take the form of any of the embodiments discussed above with reference to the IC package 1320.

The IC device assembly 1300 illustrated in FIG. 22 includes a package-on-package structure 1334 coupled to the second face 1342 of the circuit board 1302 by coupling components 1328. The package-on-package structure 1334 may include an IC package 1326 and an IC package 1332 coupled together by coupling components 1330 such that the IC package 1326 is disposed between the circuit board 1302 and the IC package 1332. The coupling components 1328 and 1330 may take the form of any of the embodiments of the coupling components 1316 discussed above, and the IC packages 1326 and 1332 may take the form of any of the embodiments of the IC package 1320 discussed above. The package-on-package structure 1334 may be configured in accordance with any of the package-on-package structures known in the art.

Figure 23:
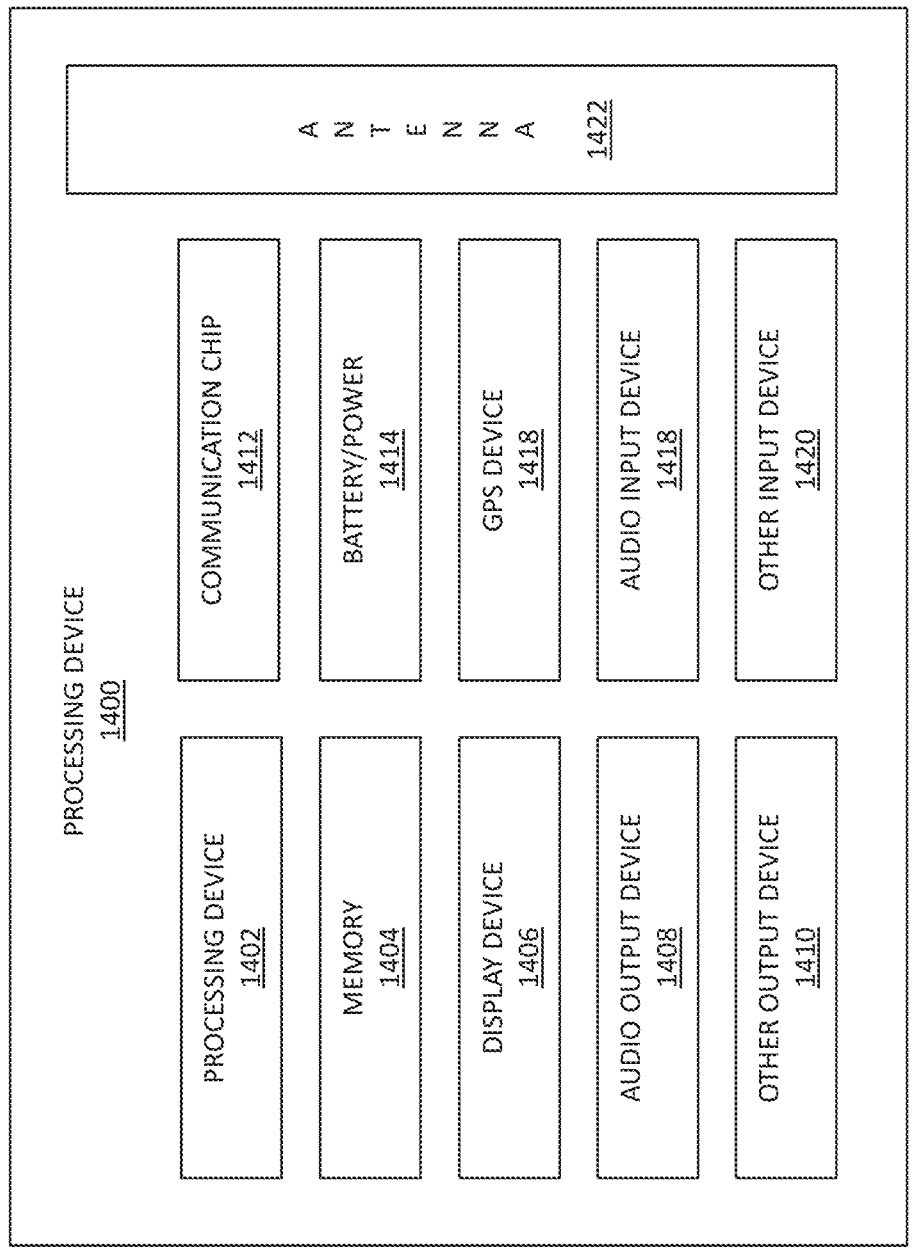
FIG. 23 is a block diagram of an example computing device that may include one or more 1T-1FE-FET memory cells in accordance with any of the embodiments disclosed herein.

FIG. 23 is a block diagram of an example computing device 1400 that may include one or more components including one or more 1T-1FE-FET memory cells in accordance with any of the embodiments disclosed herein. For example, any suitable ones of the components of the computing device 1400 may include a die (e.g., the die 1102 (FIG. 20B)) having access transistors 101 and ferroelectric transistor 103 forming one or more 1T-1FE-FET memory cells 100. Any one or more of the components of the computing device 1400 may include, or be included in, an IC device 1200 (FIG. 21). Any one or more of the components of the computing device 1400 may include, or be included in, an IC device assembly 1300 (FIG. 22).

A number of components are illustrated in FIG. 23 as included in the computing device 1400, but any one or more of these components may be omitted or duplicated, as suitable for the application. In some embodiments, some or all of the components included in the computing device 1400 may be attached to one or more motherboards. In some embodiments, some or all of these components are fabricated onto a single system-on-a-chip (SoC) die.

Additionally, in various embodiments, the computing device 1400 may not include one or more of the components illustrated in FIG. 23, but the computing device 1400 may include interface circuitry for coupling to the one or more components. For example, the computing device 1400 may not include a display device 1406, but may include display device interface circuitry (e.g., a connector and driver circuitry) to which a display device 1406 may be coupled. In another set of examples, the computing device 1400 may not include an audio input device 1424 or an audio output device 1408, but may include audio input or output device interface circuitry (e.g., connectors and supporting circuitry) to which an audio input device 1424 or audio output device 1408 may be coupled.

The computing device 1400 may include a processing device 1402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 1400 may include a memory 1404, which may itself include one or more 1T-1FE-FET memory cells as described herein, one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1404 may include memory that shares a die with the processing device 1402. This memory may be used as cache memory and may include embedded dynamic random access memory (eDRAM) or spin transfer torque magnetic random-access memory (STT-M RAM).

In some embodiments, the computing device 1400 may include a communication chip 1412 (e.g., one or more communication chips). For example, the communication chip 1412 may be configured for managing wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-805 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1412 may operate in accordance with other wireless protocols in other embodiments. The computing device 1400 may include an antenna 1422 to facilitate wireless communications and/or to receive other wireless communications (such as AM or FM radio transmissions).

In some embodiments, the communication chip 1412 may manage wired communications, such as electrical, optical, or any other suitable communication protocols (e.g., the Ethernet). As noted above, the communication chip 1412 may include multiple communication chips. For instance, a first communication chip 1412 may be dedicated to shorter-range wireless communications such as Wi-Fi or Bluetooth, and a second communication chip 1412 may be dedicated to longer-range wireless communications such as GPS, EDGE, GPRS, CDMA, WiMAX, LTE, EV-DO, or others. In some embodiments, a first communication chip 1412 may be dedicated to wireless communications, and a second communication chip 1412 may be dedicated to wired communications.

The computing device 1400 may include battery/power circuitry 1414. The battery/power circuitry 1414 may include one or more energy storage devices (e.g., batteries or capacitors) and/or circuitry for coupling components of the computing device 1400 to an energy source separate from the computing device 1400 (e.g., AC line power).

The computing device 1400 may include a display device 1406 (or corresponding interface circuitry, as discussed above). The display device 1406 may include any visual indicators, such as a heads-up display, a computer monitor, a projector, a touchscreen display, a liquid crystal display (LCD), a light-emitting diode display, or a flat panel display, for example.

The computing device 1400 may include an audio output device 1408 (or corresponding interface circuitry, as discussed above). The audio output device 1408 may include any device that generates an audible indicator, such as speakers, headsets, or earbuds, for example.

The computing device 1400 may include an audio input device 1424 (or corresponding interface circuitry, as discussed above). The audio input device 1424 may include any device that generates a signal representative of a sound, such as microphones, microphone arrays, or digital instruments (e.g., instruments having a musical instrument digital interface (MIDI) output).

The computing device 1400 may include a global positioning system (GPS) device 1418 (or corresponding interface circuitry, as discussed above). The GPS device 1418 may be in communication with a satellite-based system and may receive a location of the computing device 1400, as known in the art.

The computing device 1400 may include an other output device 1410 (or corresponding interface circuitry, as discussed above). Examples of the other output device 1410 may include an audio codec, a video codec, a printer, a wired or wireless transmitter for providing information to other devices, or an additional storage device.

The computing device 1400 may include an other input device 1420 (or corresponding interface circuitry, as discussed above). Examples of the other input device 1420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1400 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1400 may be any other electronic device that processes data.

The following paragraphs provide various examples of the embodiments disclosed herein.

Example 1 provides an apparatus including an access transistor and a ferroelectric cell including a ferroelectric transistor, where the ferroelectric cell is coupled to the access transistor and is both programmable (i.e. can be written to) and readable (i.e. can be read from) by the access transistor.

Example 2 provides the apparatus according to Example 1, where a gate terminal of the access transistor is coupled to a word-line (WL) (i.e., the access transistor is controllable by the WL), the WL configured to be used for both programming and reading of the ferroelectric transistor. Thus, the ferroelectric transistor is both programmable and readable via the WL, or, in other words, the WL is used to assist in performing both a READ and a WRITE operation on the ferroelectric transistor).

Example 3 provides the apparatus according to Examples 1 or 2, where a gate terminal of the ferroelectric transistor is coupled to a ferroelectric-line (FL) (i.e., the ferroelectric transistor is controllable by the FL), the FL configured to be used for programming of the ferroelectric transistor. Thus, the FL is used to assist in performing a WRITE operation on the ferroelectric transistor).

Example 4 provides the apparatus according to any one of Examples 1-3, where a first terminal of a ferroelectric transistor terminal pair including a source terminal and a drain terminal of the ferroelectric transistor is coupled to a source-line (SL) and a first terminal of an access transistor terminal pair including a source terminal and a drain terminal of the access transistor is coupled to a bit-line (BL).

Example 5 provides the apparatus according to Example 4, where a second terminal of the ferroelectric transistor terminal pair is coupled to a second terminal of the access transistor terminal pair.

Example 6 provides the apparatus according to any one of the preceding Examples, where the ferroelectric transistor includes a ferroelectric material disposed between a gate terminal of the ferroelectric transistor and a channel material of the ferroelectric transistor.

Example 7 provides the apparatus according to any one of the preceding Examples, where the channel material of the ferroelectric transistor is shaped as a fin extending away from a substrate over which the access transistor and the ferroelectric transistor are provided and the gate terminal (i.e. the gate electrode) of the ferroelectric transistor wraps around the fin, or the channel material of the ferroelectric transistor is shaped as a wire disposed over the substrate and the gate terminal of the ferroelectric transistor wraps around the wire.

Example 8 provides the apparatus according to any one of the preceding Examples, where the access transistor includes the ferroelectric material disposed between a gate terminal of the access transistor and a channel material of the access transistor.

Example 9 provides the apparatus according to Example 8, where the channel material of the access transistor is shaped as a fin extending away from a substrate over which the access transistor and the ferroelectric transistor are provided and the gate terminal of the access transistor wraps around the fin, or the channel material of the access transistor is shaped as a wire provided over the substrate and the gate terminal of the access transistor wraps around the wire.

Example 10 provides the apparatus according to any one of the preceding Examples, where the ferroelectric material has a thickness between 1 nanometers and 10 nanometers.

Example 11 provides the apparatus according to any one of the preceding Examples, where the ferroelectric material includes one or more of hafnium zirconium oxide, silicon-doped hafnium oxide, germanium-doped hafnium oxide, aluminum-doped hafnium oxide, and yttrium-doped hafnium oxide.

Example 12 provides a method of operating an apparatus including an access transistor and a ferroelectric transistor, the method including driving a world-line (WL) (i.e. applying voltage or current to the WL), coupled to a gate terminal of the access transistor, to cause the access transistor to turn on; and programming the ferroelectric transistor by driving a bit-line (BL) (i.e. applying voltage or current to the BL) coupled to a first terminal of an access transistor terminal pair including a source terminal and a drain terminal of the access transistor to charge or discharge an intermediate node coupled to the access transistor when the access transistor is turned on, where the ferroelectric transistor is coupled to the intermediate node, a source terminal or a drain terminal of the ferroelectric transistor is coupled to a second terminal of the access transistor terminal pair via the intermediate node, and the ferroelectric transistor is programmable according to a charge on the charged or discharged intermediate node (in other words, a logic state is programmed in the ferroelectric transistor according to the charge on the charged or discharged intermediate node).

Example 13 provides the method according to Example 12, further including applying a first voltage or current to a ferroelectric-line (FL) (i.e. driving the FL) coupled to a gate terminal of the ferroelectric transistor to generate a non-zero electric field across a ferroelectric material of the ferroelectric transistor, where the ferroelectric transistor is programmable according to the generated electric field (i.e. the ferroelectric transistor is programmable according to both the charge on the charged or discharged intermediate node, which is controlled via the BL, and the electric field applied across the ferroelectric material of this transistor, which is controlled via the FL).

Example 14 provides the method according to Examples 12 or 13, where driving the WL and driving the BL (i.e. the processes of the method of Example 12) are performed after applying the first voltage to the FL to cause an electric field applied across the ferroelectric material of the ferroelectric transistor).

Example 15 provides the method according to any one of Examples 12-14, where application of the first voltage to the FL causes a first logic state to be programmed on the ferroelectric transistor, the method further including applying a second voltage or current to the FL after applying the first voltage to the FL, where application of the second voltage to the FL together with driving the WL and the BL causes a second logic state to be programmed on the ferroelectric transistor.

Example 16 provides the method according to any one of Examples 12-15, where programming a logic state on the ferroelectric transistor includes applying a first voltage or current to a ferroelectric-line (FL) (i.e. driving the FL) coupled to a gate terminal of the ferroelectric transistor to ensure that a polarization of a ferroelectric material of the ferroelectric transistor corresponds to a first logic state; after applying the first voltage, applying a second voltage to the FL, the second voltage being insufficient to switch the polarization of the ferroelectric material; and driving the WL and the BL for a suitable duration to charge or discharge the intermediate node so that a charge on the intermediate node together with the second voltage applied to the FL is sufficient to switch the polarization of the ferroelectric material from the first logic state to the second logic state.

Example 17 provides the method according to any one of Examples 12-16, further including reading the ferroelectric transistor by sensing the BL (i.e. sensing voltage or current on the BL, using a sense amplifier coupled to the BL) to determine a logic state programmed in the ferroelectric transistor.

Example 18 provides a method of operating an apparatus including an access transistor and a ferroelectric transistor, the method including driving a world-line (WL) (i.e. applying voltage or current to the WL), coupled to a gate terminal of the access transistor, to cause the access transistor to turn on and to cause a current on a bit-line (BL) through the access transistor and the ferroelectric transistor coupled to the access transistor in series by having a source terminal or a drain terminal of the ferroelectric transistor being coupled to a source terminal or a drain terminal of the access transistor; and reading the ferroelectric transistor by sensing the current on the BL to determine a logic state programmed in the ferroelectric transistor.

Example 19 provides the method according to Example 18, where the ferroelectric transistor includes a ferroelectric material disposed between a gate terminal of the ferroelectric transistor and a channel material of the ferroelectric transistor.

Example 20 provides a computing device, including a substrate; and an integrated circuit (IC) die coupled to the substrate, where the IC die includes a memory device including a plurality of memory cells. Each memory cell has an access transistor, and a ferroelectric cell including a ferroelectric transistor, where the ferroelectic cell is coupled to the access transistor and is both programmable and readable by the access transistor.

Example 21 provides the computing device according to Example 20, where a gate terminal of the access transistor is coupled to a word-line (WL) for turning the access transistor on and off, and a gate terminal of the ferroelectric transistor is coupled to a ferroelectric-line (FL) for performing WRITE operations to/on the memory cell.

Example 22 provides the computing device according to Examples 20 or 21, where a first terminal of a ferroelectric transistor terminal pair including a source terminal and a drain terminal of the ferroelectric transistor is coupled to a source-line (SL), a first terminal of an access transistor terminal pair including a source terminal and a drain terminal of the access transistor is coupled to a bit-line (BL), and a second terminal of the ferroelectric transistor terminal pair is coupled to a second terminal of the access transistor terminal pair.

Example 23 provides the computing device according to any one of Examples 20-22, where the computing device is a wearable or handheld computing device.

Example 24 provides the computing device of any according to any one of Examples 20-23, where the computing device further includes one or more communication chips and an antenna.

Example 25 provides the computing device of any according to any one of Examples 20-24, where the substrate is a motherboard.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The invention claimed is:

1. An apparatus, comprising:
an access transistor; and
a ferroelectric transistor, comprising a ferroelectric material between a gate electrode material of the ferroelectric transistor and a channel material of the ferroelectric transistor, wherein,
a ferroelectric transistor terminal pair includes a source terminal and a drain terminal of the ferroelectric transistor,
an access transistor terminal pair includes a source terminal and a drain terminal of the access transistors,
a first terminal of the ferroelectric transistor terminal pair is coupled to a first terminal of the access transistor terminal pair, and
either the channel material of the ferroelectric transistor is shaped as a fin extending away from a substrate and the gate electrode material of the ferroelectric transistor wraps around the fin, or the channel material of the ferroelectric transistor is shaped as a wire disposed over the substrate and the gate electrode material of the ferroelectric transistor wraps around the wire.

2. The apparatus according to claim 1, wherein a gate terminal of the access transistor is coupled to a word-line (WL).

3. The apparatus according to claim 1, wherein a gate terminal of the ferroelectric transistor is coupled to a ferroelectric-line (FL).

4. The apparatus according to claim 1, wherein a second terminal of the ferroelectric transistor terminal pair is coupled to a source-line (SL).

5. The apparatus according to claim 1, wherein a second terminal of the access transistor terminal pair is coupled to a bit-line (BL).

6. The apparatus according to claim 1, wherein the access transistor includes the ferroelectric material between a gate electrode material of the access transistor and a channel material of the access transistor.

7. The apparatus according to claim 6, wherein:
the channel material of the access transistor is shaped as a fin extending away from a substrate and the gate electrode material of the access transistor wraps around the fin, or
the channel material of the access transistor is shaped as a wire provided over the substrate and the gate electrode material of the access transistor wraps around the wire.

8. The apparatus according to claim 1, wherein the ferroelectric material has a thickness between 1 nanometers and 10 nanometers.

9. The apparatus according to claim 1, wherein the ferroelectric material includes one or more of hafnium zirconium oxide, silicon-doped hafnium oxide, germanium-doped hafnium oxide, aluminum-doped hafnium oxide, and yttrium-doped hafnium oxide.

10. The apparatus according to claim 1, wherein the access transistor and the ferroelectric transistor are a part of a memory cell, and the memory cell is one of a plurality of memory cells of the apparatus.

11. The apparatus according to claim 10, wherein the apparatus is a memory array.

12. An apparatus, comprising:
an access transistor; and
a ferroelectric transistor,
wherein:
a ferroelectric transistor terminal pair includes a source terminal and a drain terminal of the ferroelectric transistor,
an access transistor terminal pair includes a source terminal and a drain terminal of the access transistor,
a first terminal of the ferroelectric transistor terminal pair is coupled to a first terminal of the access transistor terminal pair, the ferroelectric transistor includes a ferroelectric material between a gate electrode material of the ferroelectric transistor and a channel material of the ferroelectric transistor, and the ferroelectric material has a thickness between 1 nanometers and 10 nanometers.

13. The apparatus according to claim 12, wherein the access transistor includes the ferroelectric material between a gate electrode material of the access transistor and a channel material of the access transistor.

14. The apparatus according to claim 13, wherein:

the channel material of the access transistor is shaped as a fin extending away from a substrate and the gate electrode material of the access transistor wraps around the fin, or the channel material of the access transistor is shaped as a wire provided over the substrate and the gate electrode material of the access transistor wraps around the wire.

15. The apparatus according to claim 12, wherein the access transistor and the ferroelectric transistor are a part of a memory cell, and the memory cell is one of a plurality of memory cells of the apparatus.

16. The apparatus according to claim 12, wherein the apparatus is a memory array.

17. An apparatus, comprising:

an access transistor; and a ferroelectric transistor, wherein:

a ferroelectric transistor terminal pair includes a source terminal and a drain terminal of the ferroelectric transistor, an access transistor terminal pair includes a source terminal and a drain terminal of the access transistor, a first terminal of the ferroelectric transistor terminal pair is coupled to a first terminal of the access transistor terminal pair, and a second terminal of the access transistor terminal pair is coupled to a sense amplifier configured to sense a logic state programmed in the ferroelectric transistor.

18. The apparatus according to claim 17, further comprising a bit-line (BL), wherein the second terminal of the access transistor terminal pair is coupled to the sense amplifier by the second terminal of the access transistor terminal pair being coupled to the BL and the BL being coupled to the sense amplifier.

19. The apparatus according to claim 17, wherein:

the ferroelectric transistor includes a ferroelectric material between a gate electrode material of the ferroelectric transistor and a channel material of the ferroelectric transistor, and either the channel material of the ferroelectric transistor is shaped as a fin extending away from a substrate and the gate electrode material of the ferroelectric transistor wraps around the fin, or the channel material of the ferroelectric transistor is shaped as a wire disposed over the substrate and the gate electrode material of the ferroelectric transistor wraps around the wire.

20. The apparatus according to claim 17, wherein:

the access transistor and the ferroelectric transistor are a part of a memory cell, the memory cell is one of a plurality of memory cells of the apparatus, and the apparatus is a memory array.

* * * * *

UNITED STATES PATENT AND TRADEMARK OFFICE
CERTIFICATE OF CORRECTION

PATENT NO. : 10,998,339 B2  
APPLICATION NO. : 16/347085  
DATED : May 4, 2021  
INVENTOR(S) : Daniel H. Morris et al.

Page 1 of 1

It is certified that error appears in the above-identified patent and that said Letters Patent is hereby corrected as shown below:

In the Claims

In Column 36, Claim 1, Line 1, delete "wherein," and insert -- wherein: --, therefor.

Signed and Sealed this
Tenth Day of August, 2021

Drew Hirshfeld
*Performing the Functions and Duties of the*
*Under Secretary of Commerce for Intellectual Property and*
*Director of the United States Patent and Trademark Office*